(12) United States Patent
Tanaka

(10) Patent No.: US 11,459,228 B2
(45) Date of Patent: Oct. 4, 2022

(54) PHYSICAL QUANTITY SENSOR, SENSOR DEVICE, ELECTRONIC DEVICE, AND VEHICLE

(71) Applicant: SEIKO EPSON CORPORATION, Tokyo (JP)

(72) Inventor: Satoru Tanaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 221 days.

(21) Appl. No.: 16/531,694

(22) Filed: Aug. 5, 2019

(65) Prior Publication Data

US 2020/0039814 A1    Feb. 6, 2020

(30) Foreign Application Priority Data

Aug. 6, 2018 (JP) .............................. JP2018-147434

(51) Int. Cl.
| | |
|---|---|
| *B81B 3/00* | (2006.01) |
| *B60W 30/02* | (2012.01) |
| *G01P 15/125* | (2006.01) |
| *G01C 19/5769* | (2012.01) |
| *G01P 15/08* | (2006.01) |

(52) U.S. Cl.
CPC .......... *B81B 3/0051* (2013.01); *B60W 30/02* (2013.01); *B81B 3/0078* (2013.01); *G01C 19/5769* (2013.01); *G01P 15/125* (2013.01); *B81B 2201/0242* (2013.01); *G01P 2015/0831* (2013.01)

(58) Field of Classification Search
CPC ............... G01P 15/125; G01P 15/0802; G01P 2015/0822; G01P 2015/0825; G01P 2015/0831; G01P 2015/0837; B81B 3/0051; B81B 3/001; B81B 3/0078; G01C 19/5769

See application file for complete search history.

(56) References Cited

U.S. PATENT DOCUMENTS

| | | | | |
|---|---|---|---|---|
| 5,914,521 | A * | 6/1999 | Gutteridge | .......... G01P 15/0802 257/415 |
| 6,065,341 | A | 5/2000 | Ishio et al. | |
| 7,121,141 | B2 * | 10/2006 | McNeil | ................. G01P 15/125 73/514.32 |
| 7,482,192 | B2 | 1/2009 | Yu et al. | |
| 9,880,192 | B2 | 1/2018 | Cheng et al. | |
| 2010/0219716 | A1 * | 9/2010 | Akashi | .................. G01P 15/125 310/309 |
| 2012/0025333 | A1 * | 2/2012 | Yoshida | ............... G01P 15/0802 257/415 |

(Continued)

FOREIGN PATENT DOCUMENTS

| | | |
|---|---|---|
| JP | H11-230986 A | 8/1999 |
| JP | 2007-307704 A | 11/2007 |

*Primary Examiner* — Helen C Kwok
(74) *Attorney, Agent, or Firm* — Workman Nydegger

(57) ABSTRACT

A physical quantity sensor includes a substrate, a movable body that is provided displaceably in a state of being opposed to the substrate and is provided with a first through-hole and a second through-hole as through-holes, and a protrusion configured integrally with the substrate at a side of the movable body of the substrate, and in which the protrusion is provided at a position where the protrusion overlaps the through-hole and the movable body in plan view.

14 Claims, 21 Drawing Sheets

(56) References Cited

U.S. PATENT DOCUMENTS

| | | | |
|---|---|---|---|
| 2012/0280591 A1* | 11/2012 | Schultz | B81B 3/0016 |
| | | | 310/300 |
| 2013/0042684 A1* | 2/2013 | Yoda | G01P 15/125 |
| | | | 73/514.01 |
| 2013/0192370 A1* | 8/2013 | Yoda | G01P 15/125 |
| | | | 73/514.01 |
| 2014/0217552 A1* | 8/2014 | Konaka | H01L 28/60 |
| | | | 257/595 |
| 2014/0338451 A1* | 11/2014 | Takagi | B81B 3/0008 |
| | | | 73/514.32 |
| 2015/0040667 A1* | 2/2015 | Tanaka | G01P 15/125 |
| | | | 73/514.32 |
| 2015/0177273 A1 | 6/2015 | Cheng et al. | |
| 2016/0216290 A1* | 7/2016 | Tang | G01P 15/0802 |
| 2017/0088413 A1* | 3/2017 | Tanaka | B81B 3/001 |

\* cited by examiner

FIG. 9
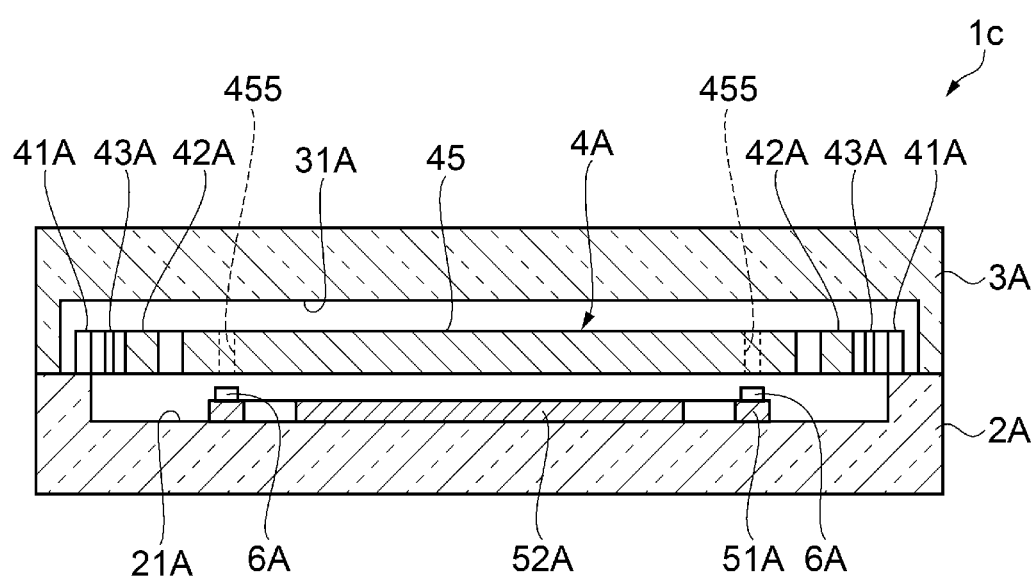
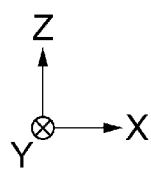

FIG. 17
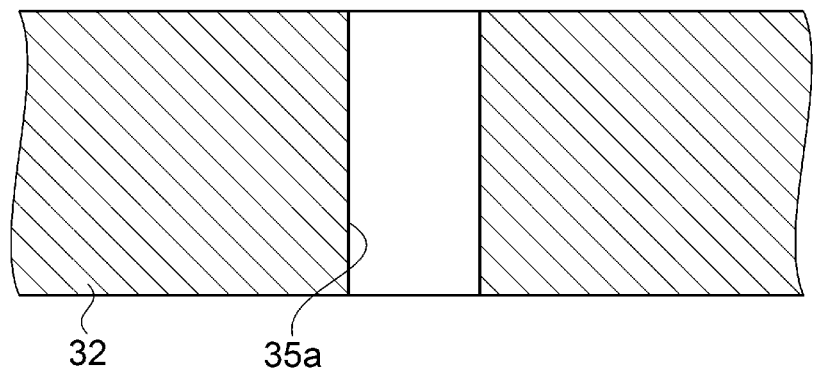
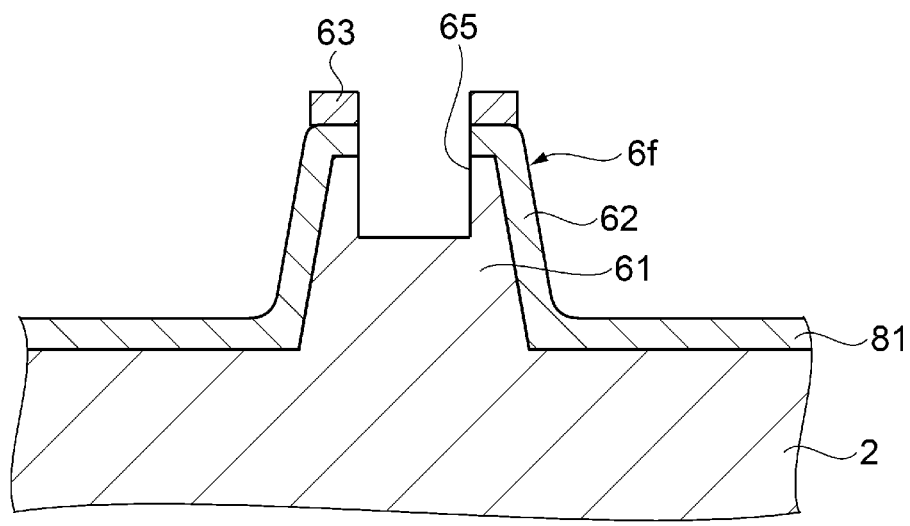
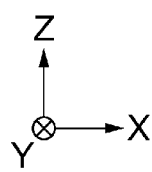

FIG. 19
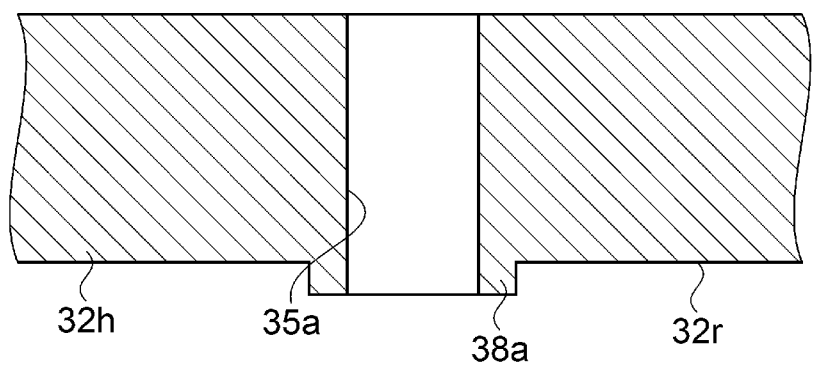
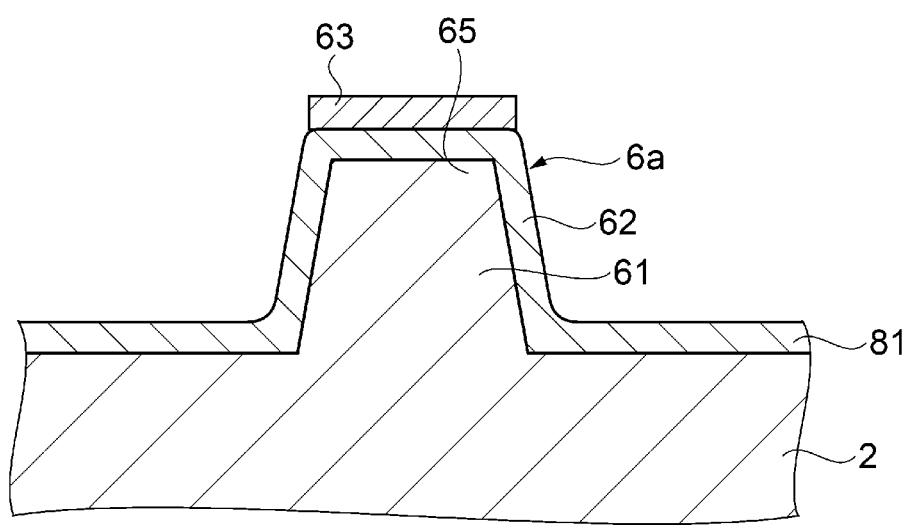
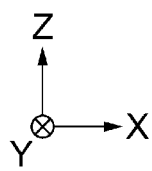

PHYSICAL QUANTITY SENSOR, SENSOR DEVICE, ELECTRONIC DEVICE, AND VEHICLE

The present application is based on, and claims priority from JP Application Serial Number 2018-147434, filed Aug. 6, 2018, the disclosure of which is hereby incorporated by reference herein in its entirety.

BACKGROUND

1. Technical Field

The present disclosure relates to a physical quantity sensor, a sensor device, an electronic device, and a vehicle.

2. Related Art

In the related art, as a physical quantity sensor for detecting a physical quantity such as acceleration or angular velocity, a micro electro mechanical system (MEMS) device including a movable body swingably supported and a substrate disposed with a gap at a position opposed to the movable body is known. For example, in US Patent Application Publication No. 2015/0177273, a MEMS device that suppresses sticking of an inertial mass and the substrate by bringing the inertial mass as the movable body and a lower protrusion (protective region) provided on the substrate into contact with a small area is described.

However, since the protrusion having a shape capable of securing toughness has a large contact area with the inertial mass, it is insufficient for suppressing sticking of the protrusion to the movable body, and there is a possibility that the protrusion may stick to the movable body depending on use environment.

SUMMARY

A physical quantity sensor according to an aspect of the present disclosure includes a substrate, a movable body that is provided displaceably in a state of being opposed to the substrate and is provided with a through-hole, and a protrusion configured integrally with the substrate at a side of the movable body of the substrate, in which the protrusion is provided at a position where the protrusion overlaps the through-hole and the movable body in plan view.

In the physical quantity sensor described above, W1<W2 may be satisfied, where W1 is a width of the through-hole and W2 is a width of the protrusion.

The physical quantity sensor described above may further include an electrode that is opposed to the movable body and is provided on the substrate, in which the protrusion may include a conductor layer having the same potential as the electrode.

In the physical quantity sensor described above, the conductor layer may be configured integrally with the electrode.

In the physical quantity sensor described above, the protrusion may have an insulating layer provided at a side opposite to the substrate with respect to the conductor layer.

In the physical quantity sensor described above, the insulating layer may be a silicon oxide film.

In the physical quantity sensor described above, the movable body may be provided swingably around a swing central axis, and may be divided into a first movable portion and a second movable portion with the swing central axis as a boundary in plan view, and the electrode may include a first electrode that is opposed to the first movable portion and is disposed on the substrate and a second electrode that is opposed to the second movable portion and is disposed on the substrate.

In the physical quantity sensor described above, an area of the second movable portion may be larger than an area of the first movable portion in plan view.

In the physical quantity sensor described above, the protrusion may be provided with a recess open to the side of the movable body.

In the physical quantity sensor described above, a plurality of the protrusions may be provided at positions parallel to a swing central axis.

A physical quantity sensor according to another aspect of the present disclosure includes a substrate, a movable body that is provided displaceably in a state of being opposed to the substrate and is provided with a first recess open to a surface opposed to the substrate, and a protrusion configured integrally with the substrate at a side of the movable body of the substrate, in which the protrusion is provided at a position where the protrusion overlaps the first recess and the movable body in plan view.

A sensor device according to still another aspect of the present disclosure includes any one of the physical quantity sensors described above, and an electronic component electrically coupled to the physical quantity sensor.

An electronic device according to still another aspect of the present disclosure includes any one of the physical quantity sensors described above, and a control unit that performs control based on a detection signal output from the physical quantity sensor.

A vehicle according to still another aspect of the present disclosure includes any one of the physical quantity sensors described above, and a control unit that performs control based on a detection signal output from the physical quantity sensor.

BRIEF DESCRIPTION OF THE DRAWINGS

FIG. 9 is a cross-sectional view taken along line IX-IX in FIG. 8.

FIG. 17 is a cross-sectional view illustrating Modification Example 2 of the protrusion.

FIG. 19 is a cross-sectional view illustrating Application Example 1 according to the configuration of the movable body provided with the through-hole.

DESCRIPTION OF EXEMPLARY EMBODIMENTS

Hereinafter, a physical quantity sensor, a sensor device, an electronic device, and a vehicle according to the present disclosure will be described in detail based on embodiments illustrated in the attached drawings. All the configurations described in the following embodiments are not necessarily essential configuration requirements of the present disclosure. In each drawing, for convenience of explanation, some constitutional elements may be omitted. In order to make it easy to understand in each drawing, the dimensional ratio of each constitutional element is different from the actual one.

1. Physical Quantity Sensor

First Embodiment

Figure 1:
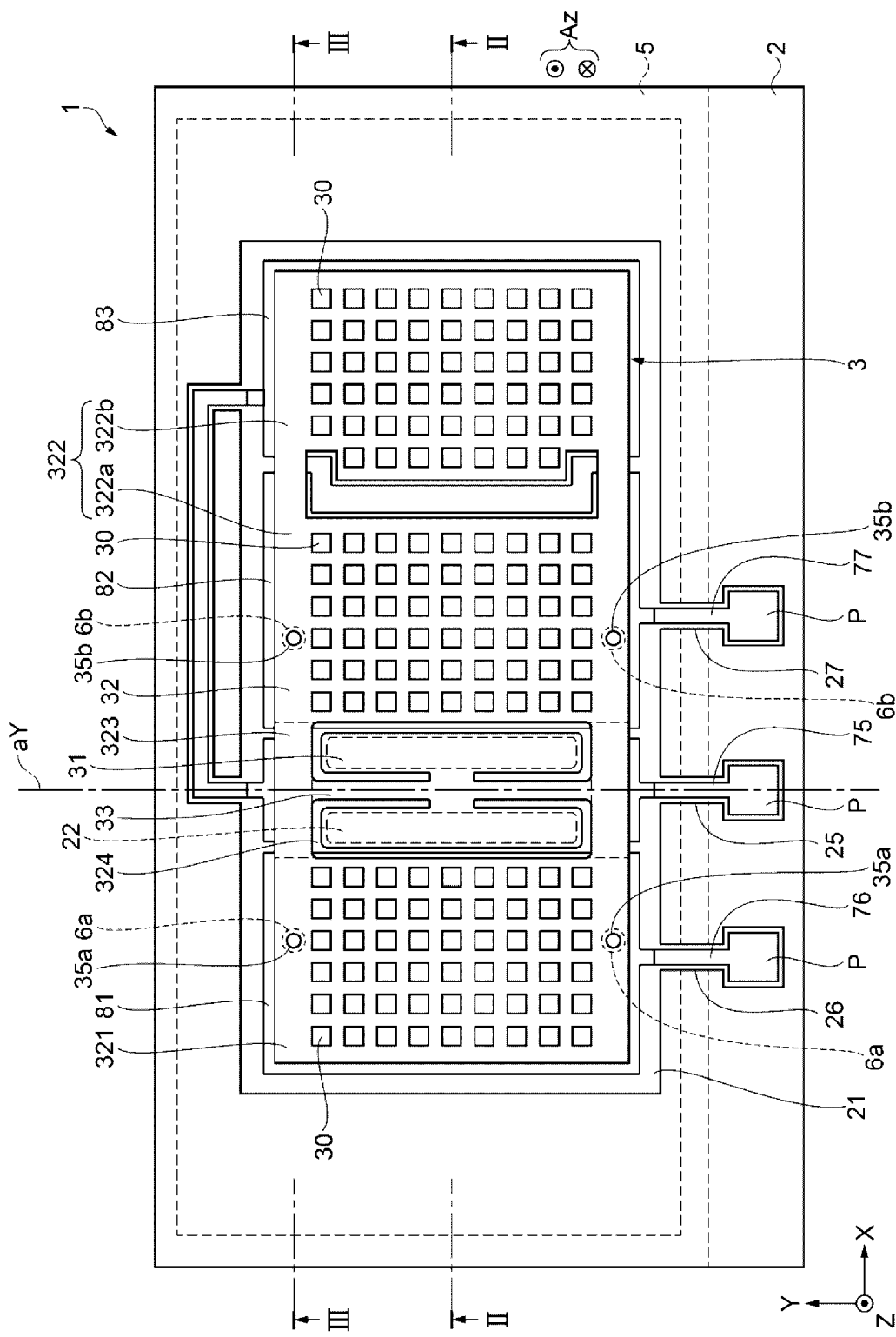
FIG. 1 is a plan view (top view) illustrating a physical quantity sensor according to a first embodiment.
Figure 2:
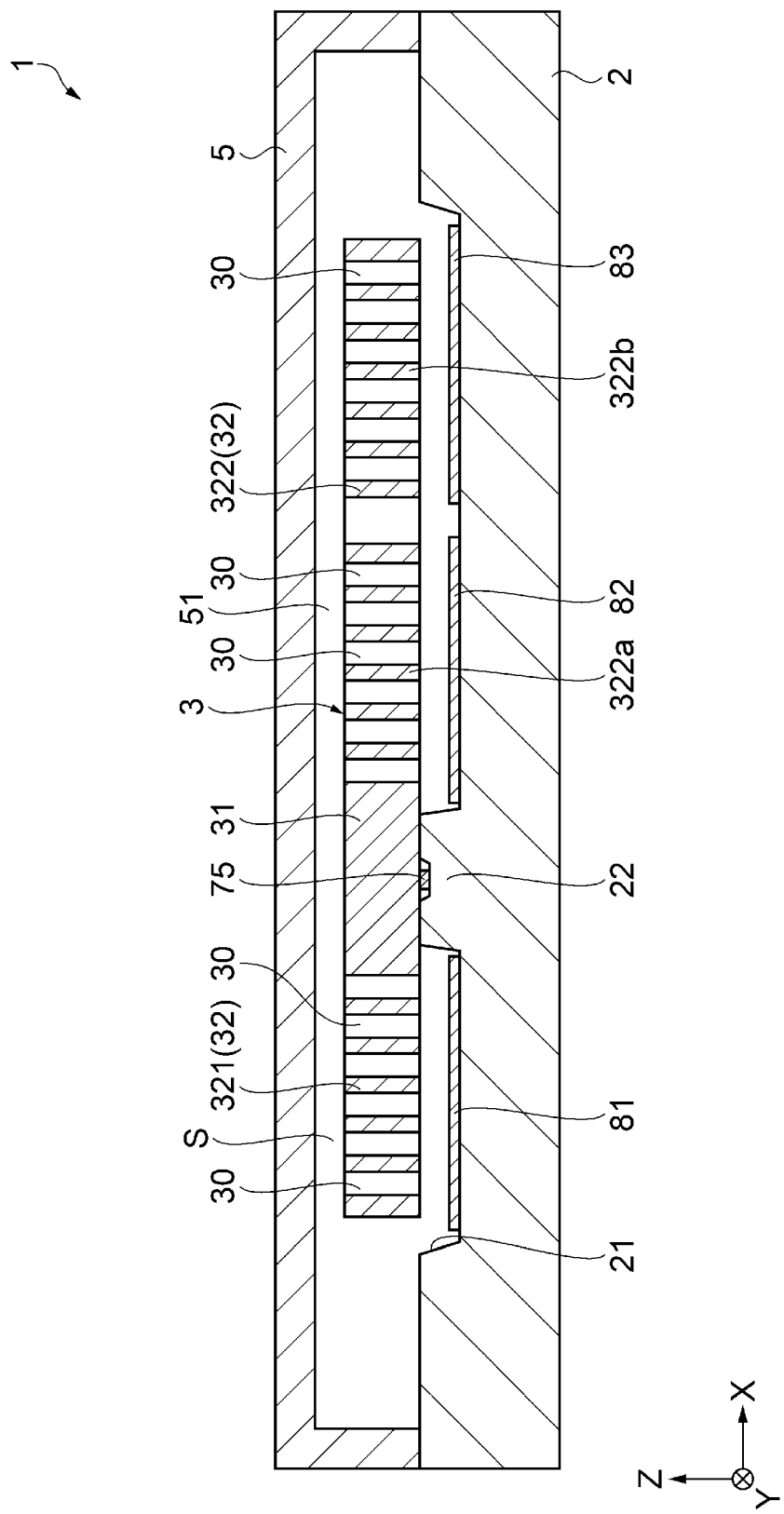
FIG. 2 is a cross-sectional view taken along line II-II in FIG. 1.
Figure 3:
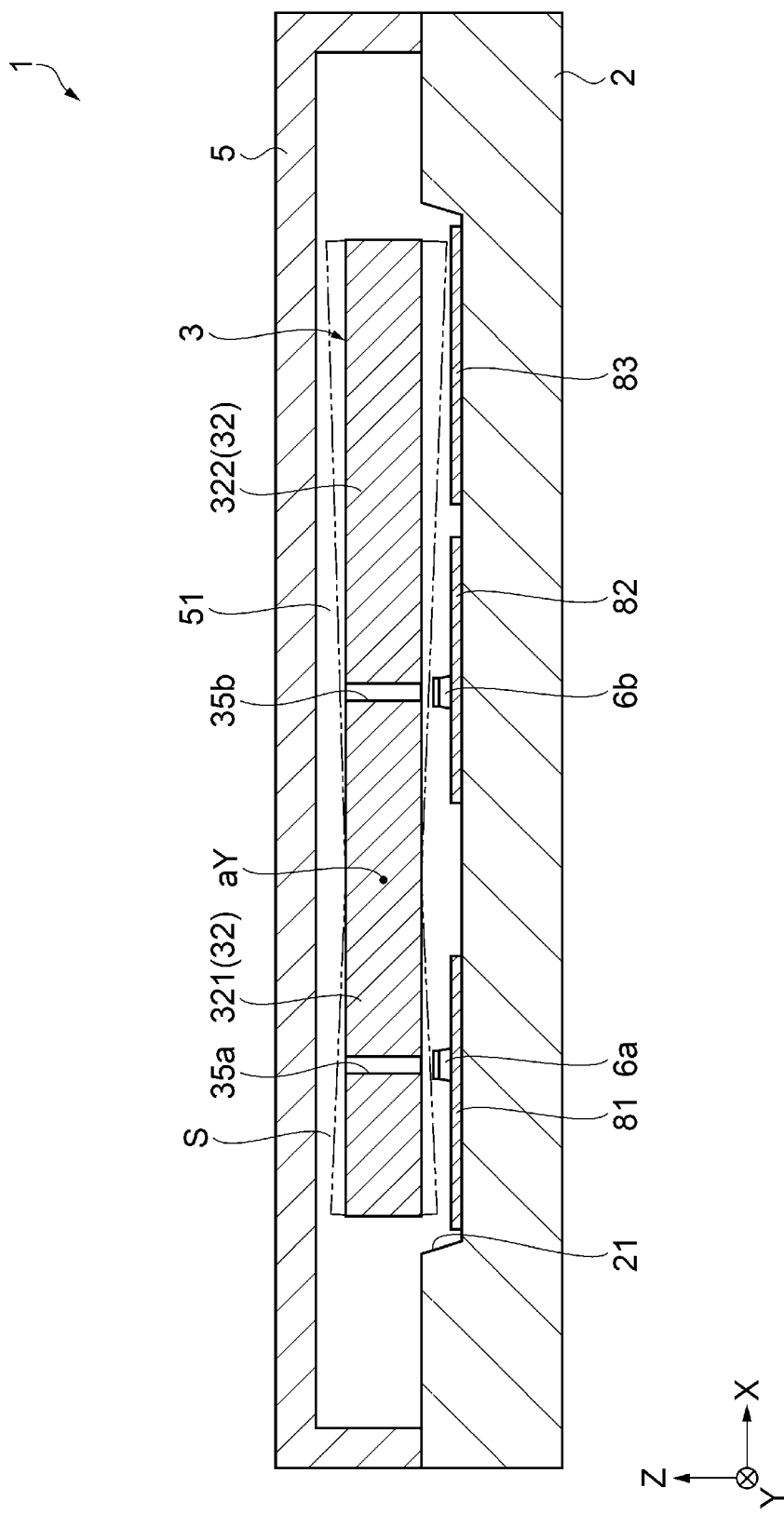
FIG. 3 is a cross-sectional view taken along line III-III in FIG. 1.
Figure 4:
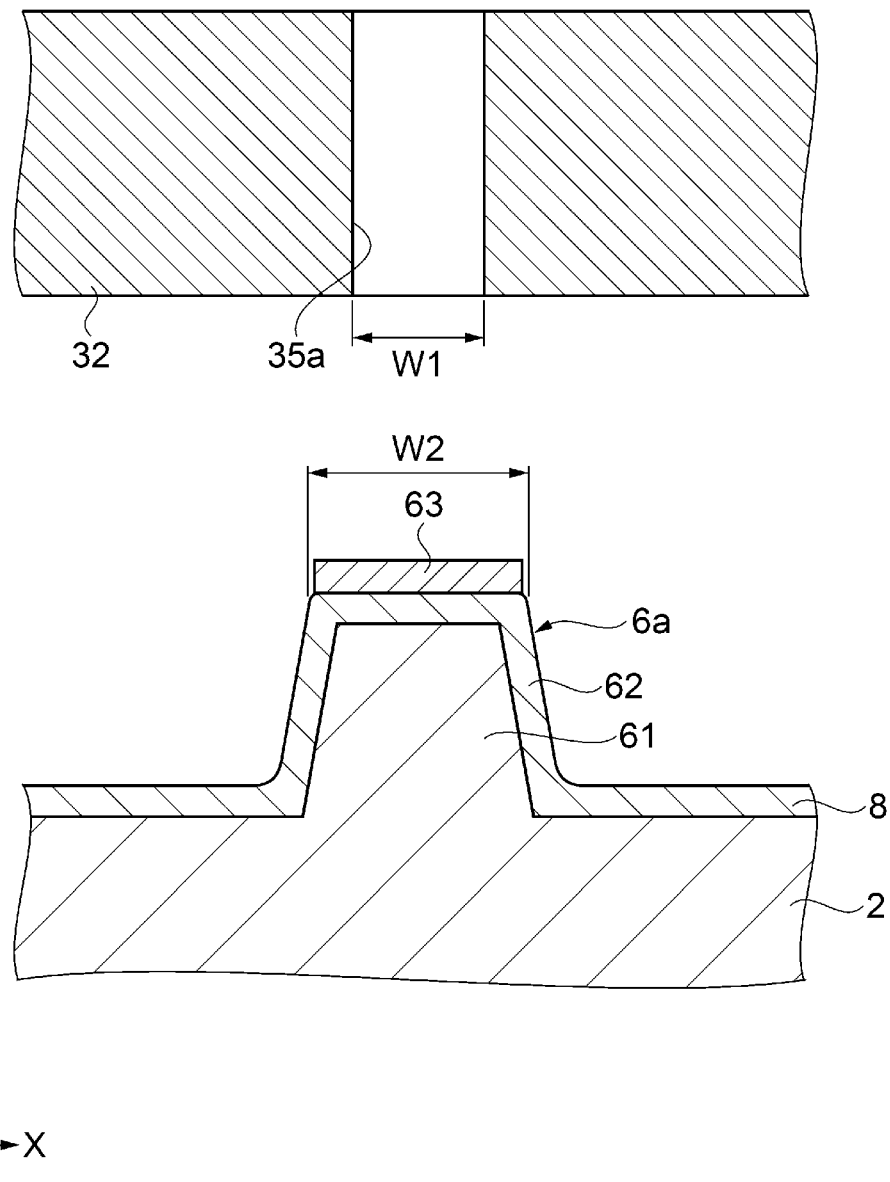
FIG. 4 is an enlarged cross-sectional view for explaining a protrusion and a through-hole provided in the physical quantity sensor illustrated in FIG. 1.

The physical quantity sensor according to the first embodiment will be described with reference to FIG. 1, FIG. 2, FIG. 3, and FIG. 4. FIG. 1 is a plan view (top view) illustrating the physical quantity sensor according to the first embodiment. In FIG. 1, for convenience, a lid is illustrated in perspective. FIG. 2 is a sectional view taken along the line II-II in FIG. 1. FIG. 3 is a cross-sectional view taken along the line III-III in FIG. 1. FIG. 4 is an enlarged cross-sectional view for explaining a protrusion and a through-hole provided in the physical quantity sensor illustrated in FIG. 1. In each drawing, for convenience of explanation, X-axis, Y-axis, and Z-axis are illustrated as three axes orthogonal to each other, and the tip end side of the arrow representing each axis is "+", and the base end side thereof is "−". In the following, a direction parallel to the X-axis is referred to as an "X-axis direction", a direction parallel to the Y-axis is referred to as a "Y-axis direction", and a direction parallel to the Z-axis is referred to as a "Z-axis direction". The +Z-axis direction side is also referred to as "above" or "upward", and the −Z-axis direction side is also referred to as "below" or "downward".

The physical quantity sensor 1 illustrated in FIG. 1, FIG. 2, and FIG. 3 is used, for example, as an inertial sensor, and more specifically, as an acceleration sensor capable of measuring acceleration Az in the Z-axis direction. Such a physical quantity sensor 1 includes a substrate 2, a swing structure (element portion) 3 disposed on the substrate 2, and a lid 5 bonded to the substrate 2 so as to cover the swing structure 3. Hereinafter, these parts will be sequentially described in detail.

Substrate

The substrate 2 has a recess 21 open to an upper surface which is a surface on an upper side of the substrate 2. In plan view from the Z-axis direction, the recess 21 is formed larger than the swing structure 3 so as to enclose the swing structure 3 inside. The recess 21 functions as a relieving portion for swinging a swing structure 3. As illustrated in FIG. 2, the substrate 2 has a protrusion-shaped mount 22 provided on the bottom surface of the recess 21. The swing structure 3 is bonded to the upper surface of the mount 22. With this configuration, the swing structure 3 can be fixed to the substrate 2 in a state of being separated from the bottom surface of the recess 21. As illustrated in FIG. 1, the substrate 2 has grooves 25, 26 and 27 open to the upper surface.

The substrate 2 may have an insulating property. For example, a glass substrate made of a glass material (for example, Pyrex (registered trademark) glass, borosilicate glass such as Tempax (registered trademark) glass) containing alkali metal ions (mobile ions such as $Na^+$) can be used. Here, when the substrate 2 is made of a glass material containing alkali metal ions, and the lid 5 and the swing structure 3 are made of silicon, the lid 5 and the swing structure 3 can be bonded to the substrate 2 by anodic bonding. However, the constituent material of the substrate 2 is not particularly limited. For example, a silicon substrate or a ceramic substrate may be used. An insulating film such as a silicon oxide film or a silicon nitride film may be formed on the surface of the substrate 2 as necessary.

As illustrated in FIG. 1, the substrate 2 includes electrodes. The electrodes include a first fixed electrode 81 as a first electrode, a second fixed electrode 82 as a second electrode, and a dummy electrode 83 disposed on the bottom of the recess 21. The substrate 2 includes wirings 75, 76, and 77 disposed inside grooves 25, 26, and 27. One end portions of the wirings 75, 76, and 77 are exposed to the outside of the lid 5 and function as electrode pads P for electrically coupling to an external device. As illustrated in FIG. 2, the wiring 75 is drawn to the mount 22 and electrically coupled to the swing structure 3 on the mount 22. The wiring 75 is also electrically coupled to the dummy electrode 83. The wiring 76 is electrically coupled to the first fixed electrode 81, and the wiring 77 is electrically coupled to the second fixed electrode 82.

The constituent materials of the first fixed electrode 81, the second fixed electrode 82, the dummy electrode 83, and the wirings 75, 76, and 77 are not particularly limited as long as they have conductivity, and examples thereof include oxides such as ITO (indium tin oxide), IZO (indium zinc oxide), $In_3O_3$, $SnO_2$, Sb-containing $SnO_2$, Al-containing ZnO (transparent electrode material), Au, Pt, Ag, Cu, Al, or alloys containing these. One or more of these materials can be used in combination.

The substrate 2 also includes a plurality of protrusions 6a and 6b for preventing or reducing sticking of the swing structure 3 to the substrate 2. As illustrated in FIGS. 1 and 3, a plurality of (four in this embodiment) protrusions 6a and 6b are disposed on the bottom surface of the recess 21 at the side of the swing structure 3 of the substrate 2 at positions where the protrusions 6a and 6b overlap the swing structure 3 in plan view from the Z-axis direction. The configuration of the protrusions 6a and 6b will be described in detail later. The number of the protrusions 6a and 6b may be set to any number, not limited to four.

Swing Structure

The swing structure 3 is provided above the substrate 2 as illustrated in FIGS. 1 and 2. The swing structure 3 includes a anchor portion 31 bonded to the upper surface of the mount 22 provided on the substrate 2, and a movable body 32 provided opposed to the substrate 2 and displaceable with respect to the anchor portion 31, and a support beam 33 coupling the anchor portion 31 and the movable body 32. Then, when acceleration Az acts along the Z-axis direction, as illustrated by an imaginary line in FIG. 3, the movable body 32 swings while torsionally deforming the support beam 33 with the support beam 33 as a rotation axis (swing central axis) aY. In other words, the movable body 32 is configured so as to be capable of seesaw swinging with respect to the anchor portion 31 with the rotation axis (swing central axis) aY as a central axis.

The movable body 32 has a rectangular shape whose long side is in the X-axis direction in plan view from the Z-axis direction. The movable body 32 includes a first mass portion 321 as a first movable portion positioned on the minus side in the X-axis direction with respect to the rotation axis aY, a second mass portion 322 as a second movable portion positioned on the plus side in the X-axis direction with respect to the rotation axis aY, and a connecting portion 323 connecting the first mass portion 321 and the second mass portion 322. The movable body 32 is coupled to the support beam 33 at the connecting portion 323. That is, the movable body 32 is divided into the first mass portion 321 as a first movable portion and the second mass portion 322 as a second movable portion with the rotation axis (swing central axis) aY as a boundary, in plan view from the Z-axis direction.

The second mass portion 322 is configured to be longer than the first mass portion 321 in the X-axis direction. Accordingly, an area of the second mass portion 322 is larger than that of the first mass portion 321 in plan view and the mass becomes larger, rotation moment (torque) when the acceleration Az is added is larger than that of the first mass portion 321. When acceleration Az is applied due to difference in rotation moment, the movable body 32 swings around the rotation axis aY. In the following, a portion which is the base end portion of the second mass portion 322 and is symmetrical to the first mass portion 321 with respect to the rotation axis aY is also referred to as a "base portion 322a" and portion which is the tip portion of the second mass portion 322 and is asymmetrical to the first mass portion 321 with respect to the rotation axis aY is also referred to as a "torque generation portion 322b". With such a configuration, it is possible to easily make moments about the swing central axes of the first mass portion 321 and the second mass portion 322 different.

The movable body 32 has an opening 324 between the first mass portion 321 and the second mass portion 322, and the anchor portion 31 and the support beam 33 are disposed in the opening 324. With such a shape, the swing structure 3 can be miniaturized. The support beam 33 extends along the Y-axis direction, and forms the rotation axis aY. However, the disposition of the anchor portion 31 and the support beam 33 is not particularly limited, and may be positioned outside the movable body 32, for example.

Here, the description returns to the electrodes (the first fixed electrode 81, the second fixed electrode 82, and the dummy electrode 83). The first fixed electrode 81 as a first electrode is disposed to oppose the first mass portion 321 in plan view from the Z-axis direction. The second fixed electrode 82 as a second electrode is disposed to oppose the base portion 322a of the second mass portion 322. The dummy electrode 83 is disposed to oppose the torque generation portion 322b of the second mass portion 322. When the physical quantity sensor 1 is driven, a predetermined voltage is applied to the swing structure 3, and a capacitance Ca is formed between the first fixed electrode 81 and the first mass portion 321, and a capacitance Cb is formed between the second fixed electrode 82 and the base portion 322a of the second mass portion 322.

When acceleration Az is applied to the physical quantity sensor 1, the movable body 32 swings about the rotation axis aY while torsionally deforming the support beam 33 due to the difference in rotational moment of the first mass portion 321 and the second mass portion 322. By such swinging of the movable body 32, a gap between the first mass portion 321 and the first fixed electrode 81 and a gap between the base portion 322a of the second mass portion 322 and the second fixed electrode 82 respectively change, and the capacitances Ca and Cb change respectively according to the change of the gap. For that reason, the physical quantity sensor 1 can measure the acceleration Az based on an amount of change in the capacitances Ca and Cb.

The first mass portion 321 and the second mass portion 322 are each formed with a plurality of damping holes 30 penetrating the movable body 32 in the thickness direction along the Z-axis. The plurality of damping holes 30 are uniformly disposed over the entire region of the first mass portion 321 and the second mass portion 322. In particular, in this embodiment, the plurality of damping holes 30 are disposed in a matrix arranged in the X-axis direction and the Y-axis direction. Each of the plurality of damping holes 30 has a square cross-sectional shape, and has the same shape and size as each other. In the first mass portion 321, the base portion 322a and the torque generation portion 322b, occupancy rates of the plurality of damping holes 30 are equal.

The term "uniform" is meant to include a case in which some of the separation distances are slightly (for example, within about 10%) deviated from the other separation distances, for example, by taking into account manufacturing errors and the like, in addition to a case where the separation distance between the damping holes 30 adjacent to each other in the X-axis direction and the Y-axis direction is equal in all the damping holes 30. Similarly, the term "square" described above is meant to include a case where a shape is slightly deviated from the square, for example, the four corners do not form corners and chamfering and R roundness (rounding) are made thereto, at least one corner is deviated from 90 degrees, or a length of at least one side is different from the length of the other side, for example, by taking into account an error that may occur in manufacturing or the like, in addition to a case where a shape agrees with a square. The "occupancy rates are equal" described above is meant to include a case where the occupancy rate is slightly deviated (for example, within about ±5%), for example, by taking into account an error that may occur in manufacturing or the like, in addition to the case where the occupancy rates of the plurality of damping holes 30 coincide with each other in the first mass portion 321, the base portion 322a, and the torque generation portion 322b.

As illustrated in FIGS. 1 and 3, in each of the first mass portion 321 and the second mass portion 322, which constitute the movable body 32, a first through-hole 35a and a second through-hole 35b are provided as a plurality of through-holes which penetrate the movable body 32 in the thickness direction along the Z-axis, at a position where the first and second through-holes 35a and 35b overlap the plurality of protrusions 6a and 6b provided on the substrate 2 in plan view from the Z-axis direction.

In detail, in the first mass portion 321 as the first movable portion, the first through-holes 35a are provided substantially at the center of the first mass portion 321 in the X-axis direction and are provided one by one at each of both end portions along the Y-axis direction. The first through-holes 35a are provided to oppose the protrusions 6a provided in the region of the first fixed electrode 81 disposed on the substrate 2 to oppose the first mass portion 321. In the second mass portion 322 as the second movable portion, the second through-holes 35b are provided substantially at the center of the base portion 322a of the second mass portion 322 in the X-axis direction and are provided one by one at each of both end portions along the Y-axis direction. The second through-holes 35b are provided to oppose the protrusions 6b provided in the region of the second fixed electrode 82 disposed on the substrate 2 to oppose the base portion 322a of the second mass portion 322. In FIG. 3, the first through-holes 35a and the second through-holes 35b have the same cross-sectional shape from the surface of the movable body 32 opposed to the lid 5 to the surface opposed to the substrate 2, that is, the wall surfaces of the first through-holes 35a and the second through-holes 35b are perpendicular to the surface of the movable body 32 opposed to the lid 5, but is not limited thereto. The wall surfaces of the first through-holes 35a and the second through-holes 35b may be inclined from the surface opposed to the lid 5 of the movable body 32 to the surface opposed to the substrate 2.

The width dimension of the first through-holes 35a and the second through-holes 35b may be smaller than the width dimension of the protrusions 6a and 6b. The first through-holes 35a will be illustrated and described in FIG. 4. As illustrated in FIG. 4, when the width of the first through-hole 35a is W1 and the width of the protrusion 6a is W2, the relationship between the width W1 of the first through-hole 35a and the width W2 of the protrusion 6a may satisfy W1<W2. Here, the "width" of the first through-hole 35a means the distance between the short sides if the first through-hole 35a has a rectangular shape. For example, if the first through-hole 35a has a circular shape, the "width" means a diameter, if the first through-hole 35a has an elliptical shape, the "width" means a short diameter distance, or if the first through-hole 35a has an oval shape, the "width" means the distance between two sides formed by straight lines. When the wall surface of the first through-hole 35a is inclined from the surface of the movable body 32 opposed to the lid 5 to the surface opposed to the substrate 2, it means the width of the surface of the movable body 32 opposed to the substrate 2. The "width" of the protrusion 6a means the distance between the short sides if the surface of the protrusion 6a opposed to the movable body 32 is rectangular. For example, if the surface of the protrusion 6a has a circular shape, the "width" means a diameter, if the surface of the protrusion 6a has an elliptical shape, the "width" means a short diameter distance, or if the surface of the protrusion 6a has an oval shape, the "width" means the distance between two sides formed by straight lines. Since the configuration of the second through-hole 35b is also the same as that of the first through-hole 35a, the description of the second through-hole 35b here will be omitted.

Thus, by making the widths W1 of the first through-holes 35a and the second through-holes 35b as the through-holes smaller than the widths W2 of the protrusions 6a and 6b, the first mass portion 321 and the second mass portion 322 constituting the movable body 32 can be brought into contact with the protrusions 6a and 6b in a small area without reducing toughness of the protrusions 6a and 6b.

For example, such a swing structure 3 can be formed by patterning a conductive silicon substrate doped with impurities such as phosphorus (P), boron (B), or arsenic (As) by etching (particularly dry etching). When the substrate 2 is made of a glass material, bonding between the swing structure 3 and the substrate 2 can be performed by anodic bonding, and the swing structure 3 in this embodiment is bonded to the upper surface of the substrate 2 by anodic bonding. However, the material of the swing structure 3 and the bonding method of the swing structure 3 and the substrate 2 are not particularly limited. The base material itself of the swing structure 3 may not have conductivity, and in this case, for example, a conductive layer such as metal may be formed on the surface of the movable body 32.

Lid

As illustrated in FIG. 2, the lid 5 has a recess 51 open to the lower surface side. The lid 5 is bonded to the upper surface of the substrate 2 so as to accommodate the swing structure 3 in the recess 51. A storage space S which accommodates the swing structure 3 is formed inside thereof by the lid 5 and the substrate 2.

A storage space S is a hermetic space. The storage space S may be filled with an inert gas such as nitrogen, helium, argon or the like, and is at substantially atmospheric pressure at a use temperature (about −40° C. to 120° C.). However, the atmosphere of the storage space S is not particularly limited, and may be, for example, a reduced pressure state or a pressurized state.

As described above, since the grooves 25, 26, and 27 extending over the inside and the outside of the storage space S are provided on the upper surface of the substrate 2, in a state where the lid 5 is merely bonded to the substrate 2, the inside and the outside of the storage space S are communicated with each other through grooves 25, 26 and 27. For that reason, for example, a sealing portion such as a $SiO_2$ film formed by the TEOS-CVD (chemical vapor deposition) method or the like is provided in the disposition portion (bonded portion of the lid 5 and the substrate 2) of the grooves 25, 26 and 27. As a result, the grooves 25, 26, and 27 can be closed to hermetically seal the storage space S.

For example, a silicon substrate can be used as the lid 5. However, the constituent material of the lid 5 is not particularly limited, and for example, a glass substrate or a ceramic substrate may be used. The method of bonding the substrate 2 and the lid 5 is not particularly limited, and may be appropriately selected depending on the materials of the substrate 2 and the lid 5. For example, anodic bonding, activated bonding to bond bonding surfaces activated by plasma irradiation, bonding by bonding material such as glass frit, diffusion bonding to bond metal films formed on the upper surface of the substrate 2 and the lower surface of the lid 5, and the like can be used. In this embodiment, the substrate 2 and the lid 5 are bonded by using anodic bonding.

The lid 5 may be coupled to the ground. With this configuration, potential of the lid 5 can be kept constant, and, for example, fluctuation of the capacitance between the lid 5 and the swing structure 3 can be reduced.

Protrusion

The physical quantity sensor 1 includes a plurality of protrusions 6a and 6b that prevent or reduce sticking of the movable body 32 (first mass portion 321 or second mass portion 322) to the substrate 2. As illustrated in FIGS. 1 and 3, the plurality of (four in this embodiment) protrusions 6a and 6b are protruded from the bottom surface of the recess 21 on the swing structure 3 side of the substrate 2 toward the movable body 32. The protrusions 6a and 6b are disposed at positions overlapping the first through-holes 35a or the second through-holes 35b, and the movable body 32 (first mass portion 321 or second mass portion 322). In other words, the protrusions 6a and 6b may have a planar shape overlapping the first through-hole 35a or the second through-hole 35b, and the movable body 32. For example, the planar shape of the protrusions 6a and 6b may be included in all of the insides of the first through-holes 35a or the second through-holes 35b, and the remaining planar shape of the protrusions 6a and 6b overlaps the movable body 32 outside the first through-hole 35a or the second through-hole 35b, or a portion of the outer edge of the planar shape of the protrusions 6a and 6b may be in the first through-hole 35a or the second through-hole 35b and the other outer edge may overlap the movable body 32.

Here, since the protrusions 6a and 6b are provided at the side of the substrate 2, toughness of the protrusions 6a and 6b can be enhanced to reduce damage to the protrusions 6a and 6b. Excessive displacement of the movable body 32 can be restricted by the protrusions 6a and 6b to prevent or reduce damage or the like of the swing structure 3 which is a structure including the movable body 32.

The protrusions 6a and 6b may be configured integrally with the substrate 2. As described above, by integrally forming the protrusions 6a and 6b and the substrate 2, toughness of the protrusions 6a and 6b can be enhanced and damage to the protrusions 6a and 6b can be reduced. The term "configuring integrally" can be defined as a state where it is composed of homogeneous materials or materials having less than 5% difference in ingredients.

The plurality of protrusions 6a and 6b are disposed at positions overlapping the end portion of the movable body 32 in the Y-axis direction in plan view from the Z-axis direction. The plurality of protrusions 6a and 6b are provided at positions in symmetrical and parallel with respect to the rotation axis (swing central axis) aY in plan view. In detail, two protrusions 6a are provided at positions parallel to the rotation axis (swing center axis) aY in plan view in such a way that the two protrusions 6a are provided at each of the end portions of the movable body 32 (first mass portion 321) positioned on both sides in the Y-axis direction and one by one at positions overlapping the first fixed electrode 81. Two protrusions 6b are provided at positions parallel to the rotation axis (swing center axis) aY in plan view in such a way that the two protrusions 6b are provided at each of the end portions of the movable body 32 (second mass portion 322) positioned on both sides in the Y-axis direction and one by one at positions overlapping the second fixed electrode 82. The two protrusions 6a and the two protrusions 6b are disposed at symmetrical positions with respect to the rotation axis (swing central axis) aY in plan view.

Thus, by disposing the protrusions 6a and 6b, it is possible to improve the positional balance when the movable body 32 (first mass portion 321 or second mass portion 322) contacts the protrusions 6a and 6b and to reduce breakage of the movable body 32 (first mass portion 321 or second mass portion 322).

Hereinafter, the configuration of the protrusions 6a and 6b will be further described in detail with reference to FIG. 4 by exemplifying the protrusion 6a which is disposed to overlap the first mass portion 321 and the first fixed electrode 81 in plan view. Since the protrusion 6b disposed so as to overlap the second mass portion 322 and the second fixed electrode 82 in plan view has a configuration similar to that of the protrusion 6a, the description thereof is omitted.

As illustrated in FIG. 4, the protrusion 6a includes a projection portion 61 integrally formed with the substrate 2, a conductor layer 62 covering the projection portion 61, and an insulating layer 63 provided at the side opposite to the projection portion 61 of the conductor layer 62.

The projection portion 61 is integrally formed with the substrate 2 at the side of the substrate 2 with respect to the conductor layer 62. With this configuration, when etching the substrate 2, it is possible to easily form the projection portion 61 having a relatively high height, and as a result, the height of the protrusion 6a can be easily increased.

Here, the conductor layer 62 is at the same potential as the first fixed electrode 81. With this configuration, for example, when the substrate 2 and the lid 5 are subjected to anodic bonding at the time of manufacturing the physical quantity sensor 1 as described in detail later, the protrusions 6a and 6b also have the same potential by electrically coupling the movable body 32 (first mass portion 321, second mass portion 322), the first fixed electrode 81, and the second fixed electrode 82, and thus, it is possible to prevent or reduce sticking of the movable body 32 (first mass portion 321 and second mass portion 322) and the substrate 2 (protrusions 6a and 6b).

The conductor layer 62 can be configured integrally with the first fixed electrode 81 constituting an electrode. In this way, the conductor layer 62 of the protrusion 6a can be formed collectively with the first fixed electrode 81 as the electrode. For that reason, complication of a manufacturing process of physical quantity sensor 1 accompanying formation of the protrusion 6a can be reduced.

The insulating layer 63 is provided on the opposite side of the conductor layer 62 to the substrate 2. More specifically, the insulating layer 63 is provided on a tip side including the top of the protrusion 6a. With this configuration, even if the movable body 32 (first mass portion 321) contacts the protrusion 6a, a short circuit between the movable body 32 (first mass portion 321) and the first fixed electrode 81 can be suppressed.

The insulating layer 63 may be made of various insulating material such as a resin material, metal oxide, silicon nitride, silicon oxide, and the like as long as the insulating layer has insulating properties, but insulating layer may be a silicon oxide film. As such, by forming the insulating layer 63 with a silicon oxide film, the insulating layer 63 having excellent insulating properties can be formed easily and precisely by a film forming method.

As described above, the width W1 of the first through-hole 35a is smaller than the width W2 at the top of the protrusion 6a on which the insulating layer 63 is provided. Here, when the planar shape of the protrusion 6a is circular, the width W2 can be reworded as the diameter of the protrusion 6a. As such, by making the width W1 of the first through-hole 35a smaller than the width W2 of the protrusion 6a, the first mass portion 321 constituting the movable body 32 and the protrusion 6a can be brought into contact with a small area without reducing toughness of the protrusion 6a.

Manufacturing Method of Physical Quantity Sensor

Figure 5:
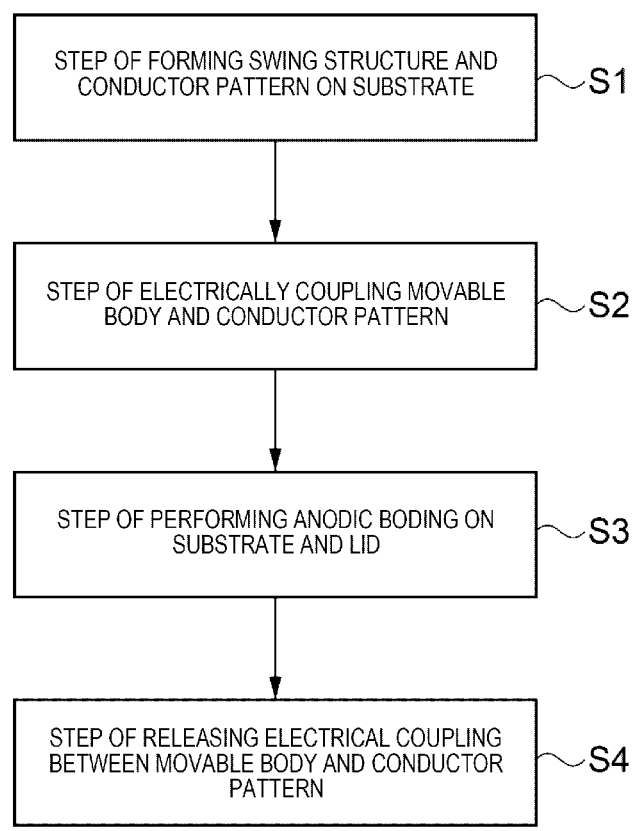
FIG. 5 is a flowchart for explaining a method of manufacturing the physical quantity sensor according to the first embodiment.

Hereinafter, a manufacturing method of the physical quantity sensor 1 described above will be described with reference to FIG. 5. FIG. 5 is a flowchart for explaining the method of manufacturing the physical quantity sensor according to the first embodiment.

A method of manufacturing the physical quantity sensor 1 includes steps of [1] forming the swing structure 3 and a conductor pattern on the substrate 2 (step S1), [2] electrically coupling respective portions of the conductor pattern (step S2), [3] bonding the substrate 2 to the lid 5 (step S3), and [4] releasing the electrical coupling in step [2] (step S4). The respective steps will be sequentially described below.

[1] First, the swing structure 3 and the conductor pattern are formed on the substrate 2. With this configuration, the movable body 32 (first mass portion 321 and second mass portion 322), electrodes including the first fixed electrode 81, the second fixed electrode 82, and the dummy electrode 83, the wirings 75, 76, and 77, the electrode pad P, and the like are formed on the substrate 2 (step S1).

Specifically, first, the substrate 2 is formed by etching a glass substrate. In this case, accompanied by formation of the substrate 2, the projection portions 61 of the protrusions 6a and 6b are formed. Then, a metal film is formed on the substrate 2, and the metal film is etched to form electrodes including the first fixed electrode 81, the second fixed electrode 82, and the dummy electrode 83, and a conductor pattern such as the wirings 75, 76, and 77, and a pad P are formed. In this case, the conductor layer 62 of the protrusions 6a and 6b is formed accompanied by formation of the conductor pattern. Thereafter, the insulating layer 63 is formed by the chemical vapor deposition (CVD) method or the like to form the protrusions 6a and 6b, and then a silicon substrate is bonded to a surface on the conductor pattern side of the substrate 2 by anodic bonding, and the silicon substrate is etched to form the opening 324, the damping hole 30, the first through-hole 35a, the second through-hole 35b, and the like, thereby forming the swing structure 3 by, for example, ion implantation of impurities such as phosphorus (P), boron (B), arsenic (As) and the like.

By doing as described above, in this step [1], the swing structure 3 including the movable body 32 (first mass portion 321 and second mass portion 322) displaceable in a state of being opposed to the substrate 2, the first fixed electrode 81, the second fixed electrode 82, and the dummy electrode 83 as electrodes opposed to the movable body 32 (the first mass portion 321 and the second mass portion 322), the conductor pattern such as wirings 75, 76, and 77 and the electrode pad P are formed on the substrate 2, and the protrusions 6a and 6b overlapping the movable body 32 (first mass portion 321 and second mass portion 322) in plan view are formed on the movable body 32 (first mass portion 321 and second mass portion 322) side of the substrate 2.

[2] Next, the respective portions of the conductor pattern are electrically coupled. With this configuration, the movable body 32 and the first fixed electrode 81 and the second fixed electrode 82 are electrically coupled (step S2).

Specifically, for example, each electrode pad P is electrically coupled by a wiring. The wiring may have a part separated from the substrate 2 like a bonding wire, or may be integrally formed on the substrate 2 with the conductor pattern.

By doing as described above, in this step [2], the movable body 32 and the first fixed electrode 81 and the second fixed electrode 82 are electrically coupled. This step can be performed simultaneously with the step [1] described above. For example, when the wiring is formed integrally with the conductor pattern, this step is performed collectively (simultaneously) with formation of the conductor pattern of the step [1] described above.

[3] Next, the substrate 2 and the lid 5 are bonded while maintaining an electrical coupling state in the step [2] described above (step S3). More specifically, for example, the substrate 2 made of glass and the lid 5 made of silicon are subjected to anodic bonding. In this case, an electric field is applied between the substrate 2 and the lid 5. As described above, since the movable body 32 and the first fixed electrode 81 and the second fixed electrode 82 are electrically coupled, the movable body 32 and the first fixed electrode 81 and the second fixed electrode 82 have the same potential. For that reason, the electric field described above is reduced between the movable body 32 and the first fixed electrode 81 and the second fixed electrode 82. As a result, the phenomenon that the movable body 32 sticks to the substrate 2 can be prevented or reduced.

As described above, in this step [3], the lid 5 is bonded to the substrate 2 in a state where the movable body 32 and the first fixed electrode 81 and the second fixed electrode 82 are electrically coupled.

[4] Next, the electrical coupling in the step [2] is released. In this step [4], for example, the wiring described above is cut or removed using a tool, a laser or the like. With this configuration, the electrical coupling between the movable body 32 and the first fixed electrode 81 and the second fixed electrode 82 is released (step S4).

As described above, in this step [4], the electrical coupling between the movable body 32 and the first fixed electrode 81 and the second fixed electrode 82 is released. Thereafter, the grooves 25, 26, and 27 are closed to form a sealing portion for hermetically sealing the storage space S. The sealing portion can be formed by, for example, a chemical vapor deposition (TEOS-CVD) method or the like. Formation of the sealing portion may be performed between the step [3] and step [4].

The physical quantity sensor 1 can be obtained through the steps [1] to [4] as described above.

According to the manufacturing method of the physical quantity sensor 1 as described above, sticking of the movable body 32 (first mass portion 321 and second mass portion 322) to the substrate 2 can be prevented or reduced even when the substrate 2 and the lid 5 are subjected to anodic bonding.

Since the first through-hole 35a or the second through-hole 35b is provided in the movable body 32 (first mass portion 321 and second mass portion 322) opposed to the protrusions 6a and 6b, in the steps [1] to [4] described above, removal of the polymers which cause sticking of the movable body 32 and the substrate 2 by adhering to the protrusions 6a and 6b and the movable body 32 (first mass portion 321 and second mass portion 322) can be performed more reliably compared to a case where the first through-hole 35a or the second through-hole 35b is not provided in the movable body 32 opposed to the protrusions 6a and 6b.

Specifically, the polymers that cause sticking of the movable body 32 and the substrate 2 are mainly adhered as follows.

1) Polymers that adheres as a sidewall deposition film by deep etching using the inductively coupled plasma (ICP) when forming the swing structure 3 including the movable body 32 (first mass portion 321 and second mass portion 322), in the step [1] described above. For example, $C_4F_8$ gas.

2) Polymers that adhere as a by-product in plasma treatment when $SiO_2$ which becomes an etching mask is peeled off when forming the swing structure 3 including the movable body 32 (first mass portion 321 and second mass portion 322), in the step [1] described above. For example, $CHF_3$ gas.

The polymers attached to the movable body 32 and the substrate 2 in this manner can be removed using, for example, $O_2$ plasma treatment. However, it is difficult for $O_2$ plasma to flow around the lower side (substrate 2 side) of the movable body 32 and the substrate 2 on the lower side of the movable body 32, and the polymer adhering thereto is difficult to be removed. In contrast, in this embodiment, since the first through-hole 35a or the second through-hole 35b is provided in the movable body 32 (first mass portion 321 and second mass portion 322) opposed to the protrusions 6a and 6b, the $O_2$ plasma can easily reach the side of the protrusions 6a and 6b from the first through-hole 35a or the second through-hole 35b, and the polymers adhered to the protrusions 6a and 6b can be more reliably removed compared to the case where the first through-hole 35a or the second through-hole 35b is not provided in the movable body 32 opposed to the protrusions 6a and 6b. With this configuration, even if the movable body 32 (first mass portion 321 and second mass portion 322) comes in contact with the protrusions 6a and 6b, sticking hardly occurs and sticking of the movable body 32 (first mass portion 321 and second mass portion 322) and the substrate 2 can be prevented or reduced.

According to the physical quantity sensor 1 according to the first embodiment described above, on the movable body 32 side of the substrate 2, the plurality of protrusions 6a and 6b are disposed at positions overlapping the movable body 32 (first mass portion 321 and second mass portion 322) in plan view. Furthermore, since the first through-hole 35a or the second through-holes 35b is provided in the movable body 32 at a position where the first or second through-hole 35a or 35b overlaps the protrusions 6a and 6b in plan view, a contact area between the movable body 32 and the protrusions 6a and 6b due to excessive displacement of the movable body 32 can be reduced. With this configuration, sticking of the movable body 32 and the protrusions 6a and 6b can be prevented or reduced without reducing toughness of the protrusions 6a and 6b.

Since the protrusions 6a and 6b are disposed at the side of the substrate 2 at the positions where the protrusions 6a and 6b overlap the first through-hole 35a or the second through-hole 35b provided in the movable body 32 in plan view, even if the protrusions 6a and 6b are enlarged, the area in contact with the movable body 32 can be kept small, and toughness of the protrusions 6a and 6b can be enhanced to reduce damage to the protrusions 6a and 6b.

Since the insulating layer 63 of the protrusions 6a and 6b is provided on the tip side of the protrusions 6a and 6b with respect to the conductor layer 62, the short circuit between the movable body 32 and the first fixed electrode 81 and the second fixed electrode 82 can be suppressed even when the movable body 32 contacts the protrusions 6a and 6b.

Furthermore, excessive displacement of the movable body 32 (first mass portion 321 and second mass portion 322) can be restricted by the protrusions 6a and 6b to prevent or reduce damage to the swing structure 3 or the like.

Second Embodiment

Figure 6:
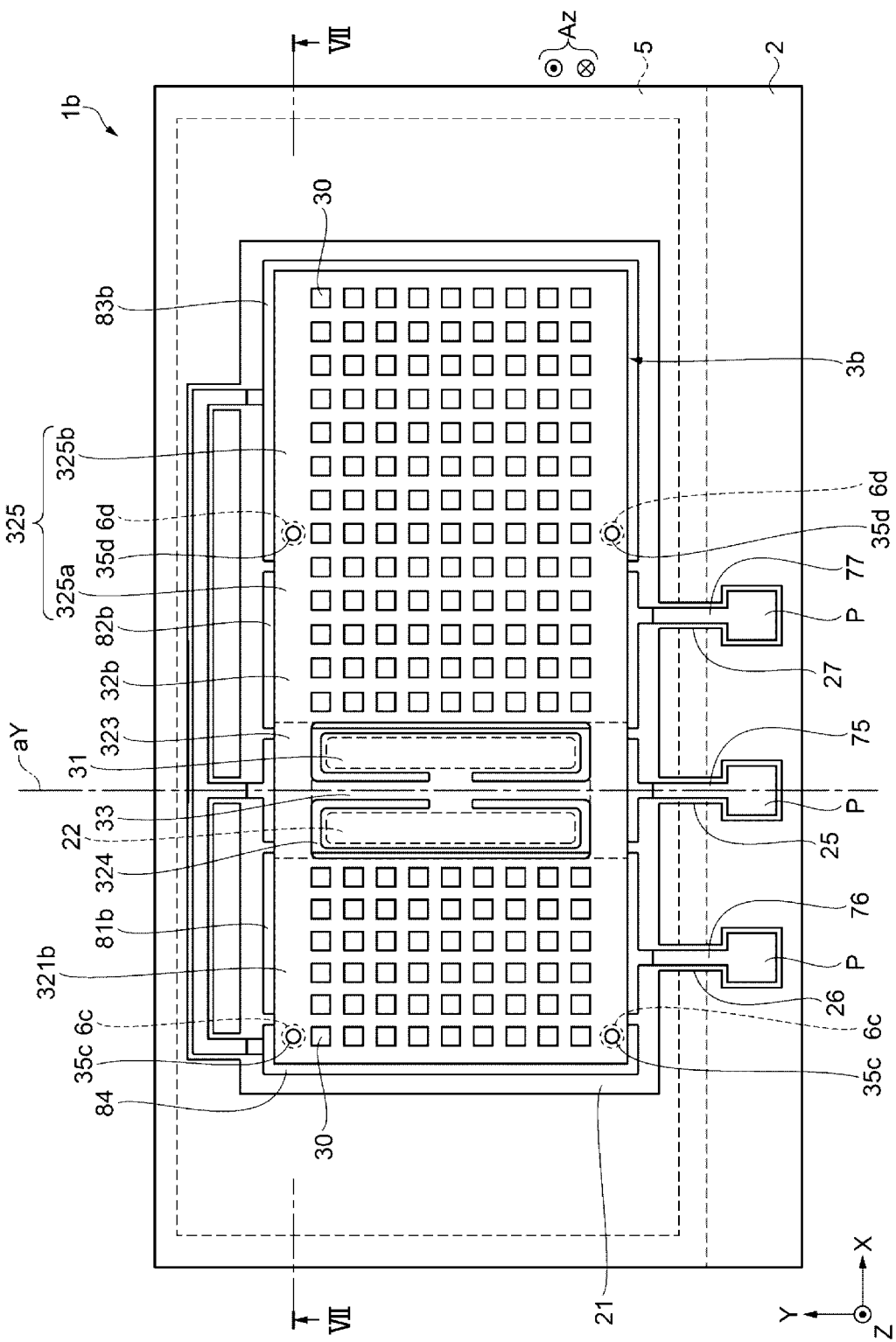
FIG. 6 is a plan view (top view) illustrating a physical quantity sensor according to a second embodiment.
Figure 7:
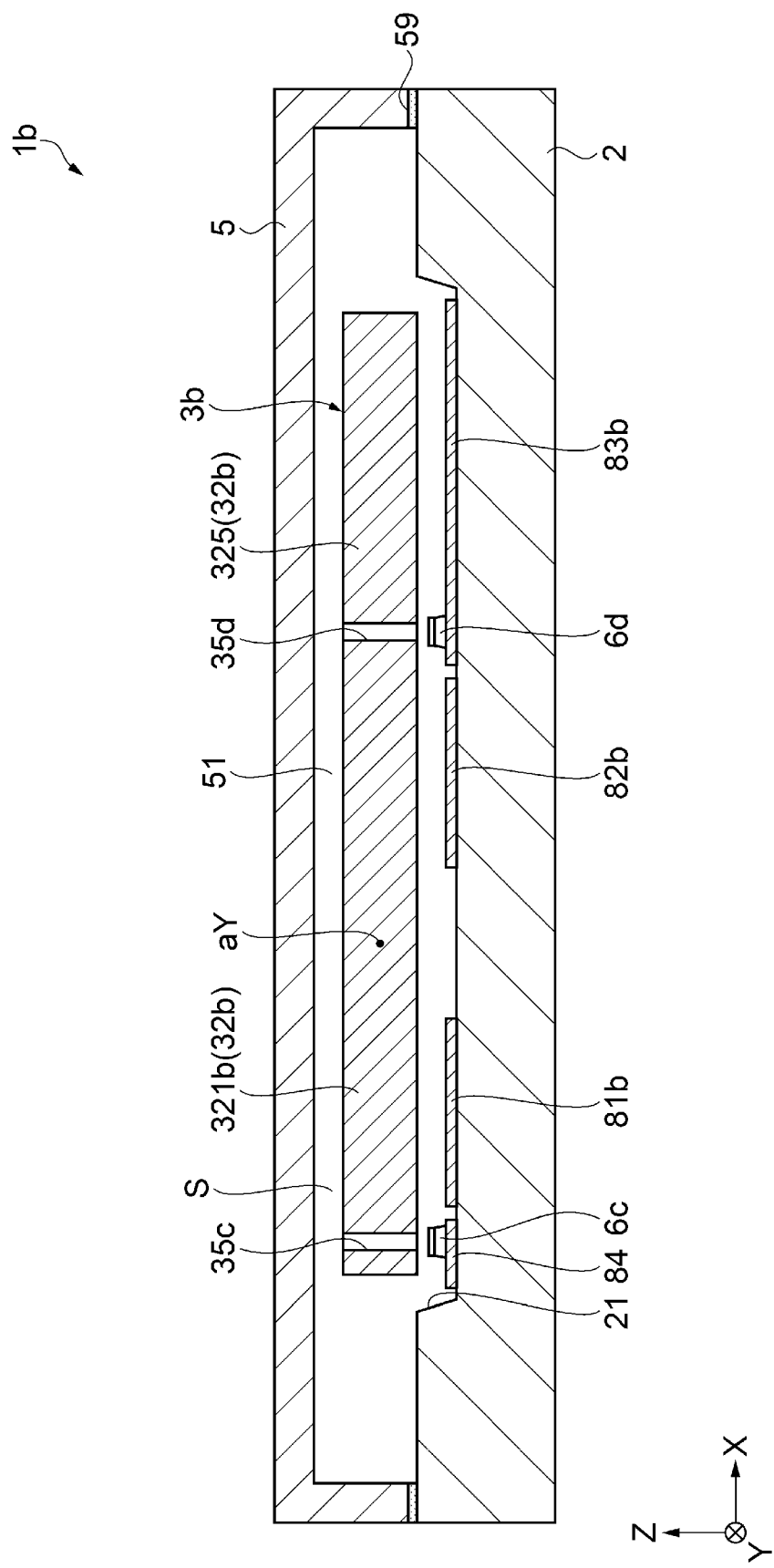
FIG. 7 is a cross-sectional view taken along line VII-VII in FIG. 6.

Next, a physical quantity sensor according to a second embodiment will be described with reference to FIGS. 6 and 7. FIG. 6 is a plan view (top view) illustrating the physical quantity sensor according to the second embodiment. FIG. 7 is a cross-sectional view taken along line VII-VII in FIG. 6.

A physical quantity sensor 1b of the second embodiment is the same as the first embodiment except for the configuration of the electrodes and the disposition of the protrusions and the through-holes. In the following description, the second embodiment will be described focusing on differences from the first embodiment described above, the same reference numerals may be attached to the same matters, and the description thereof may be omitted.

The physical quantity sensor 1b illustrated in FIG. 6 and FIG. 7 is used, for example, as an inertial sensor, and more specifically, as an acceleration sensor capable of measuring acceleration Az in the Z-axis direction. Such a physical quantity sensor 1b includes the substrate 2, a swing structure (element portion) 3b disposed on the substrate 2, and the lid 5 bonded to the substrate 2 so as to cover the swing structure 3b.

Substrate

The substrate 2 has the recess 21 open to the upper surface side. In plan view from the Z-axis direction, the recess 21 is formed larger than the swing structure 3b so as to enclose the swing structure 3b inside. The recess 21 functions as the relieving portion swinging the swing structure 3b. The substrate 2 has a protrusion-shaped mount 22 provided on the bottom surface of the recess 21. The swing structure 3b is bonded to the upper surface of the mount 22. With this configuration, the swing structure 3b can be fixed to the substrate 2 in a state of being separated from the bottom surface of the recess 21.

The substrate 2 includes electrodes. The electrodes are configured to include a first fixed electrode 81b, a second fixed electrode 82b, a first dummy electrode 83b, and a second dummy electrode 84 that are disposed on the bottom surface of the recess 21. The substrate 2 has the wirings 75, 76, and 77 disposed in the grooves 25, 26, and 27. One end portions of the wirings 75, 76, and 77 are respectively exposed to the outside of the lid 5, and respectively function as electrode pads P for electrically coupling to an external device. The wiring 75 is drawn to the mount 22 and electrically coupled to the swing structure 3b on the mount 22. The wiring 75 is also electrically coupled to the first dummy electrode 83b and the second dummy electrode 84. The wiring 76 is electrically coupled to the first fixed electrode 81b, and the wiring 77 is electrically coupled to the second fixed electrode 82b.

The substrate 2 includes a plurality of protrusions 6c and 6d for preventing or reducing sticking of the swing structure 3b to the substrate 2. The plurality of (four in this embodiment) protrusions 6c and 6d are disposed on the bottom surface of the recess 21 which is the swing structure 3b side of the substrate 2, at the positions where the plurality of protrusions 6c and 6d overlaps the swing structure 3b in plan view from the Z-axis direction, similarly as in the first embodiment described above. The protrusion 6c is disposed at a position where the protrusion 6c overlaps the second dummy electrode 84, and the protrusion 6d is disposed at a position where the protrusion 6d overlaps the first dummy electrode 83b.

Swing Structure

The swing structure 3b is provided above the substrate 2. The swing structure 3b includes a anchor portion 31 bonded to the upper surface of the mount 22 provided on the substrate 2, a movable body 32b displaceable with respect to the anchor portion 31, the support beam 33 coupling the anchor portion 31 and the movable body 32b. Then, when the acceleration Az acts, the movable body 32b swings while torsionally deforming the support beam 33 with the support beam 33 as a rotation axis (swing central axis) aY. In other words, the movable body 32b is configured so as to be capable of seesaw swinging with respect to the anchor portion 31 with the rotation axis (swing central axis) aY as a central axis.

The movable body 32b has a rectangular shape whose long side is in the X-axis direction in plan view from the Z-axis direction. The movable body 32b includes a first mass portion 321b as a first movable portion positioned on the minus side in the X-axis direction with respect to the rotation axis aY, a second mass portion 325 as a second movable portion positioned on the plus side in the X-axis direction with respect to the rotation axis aY, and a connecting portion 323 connecting the first mass portion 321b and the second mass portion 325. The movable body 32b is coupled to the support beam 33 at the connecting portion 323. The second mass portion 325 is longer than the first mass portion 321b in the X-axis direction, and rotational moment (torque) when the acceleration Az is applied is larger than that of the first mass portion 321b. Due to a difference in the rotational moment, when the acceleration Az is applied, the movable body 32b swings around the rotation axis aY. In the following, a portion which is a base end portion of the second mass portion 325 and is symmetrical to the first mass portion 321b with respect to the rotation axis aY is also referred to as a "base portion 325a". A portion which is a tip portion of the second mass portion 325 and is asymmetrical to the first mass portion 321b with respect to the rotation axis aY is also referred to as a "torque generation portion 325b".

The movable body 32b has an opening 324 between the first mass portion 321b and the second mass portion 325, and the anchor portion 31 and the support beam 33 are disposed in the opening 324. With such a shape, the swing structure 3b can be miniaturized. The support beam 33 extends along the Y-axis direction to form the rotation axis aY. However, the disposition of the anchor portion 31 and the support beam 33 is not particularly limited, and may be located outside of the movable body 32b, for example.

Here, the description returns to the electrodes (first fixed electrode 81b, second fixed electrode 82b, first dummy electrode 83b, and second dummy electrode 84). In plan view from the Z-axis direction, the first fixed electrode 81b is disposed to oppose the first mass portion 321b. The second fixed electrode 82b is disposed to oppose a base portion 325a of the second mass portion 325. The first dummy electrode 83b is disposed to oppose the torque generation portion 325b of the second mass portion 325. The second dummy electrode 84 is disposed to oppose the end portion on the minus side of the first mass portion 321b in the X-axis direction. At the time of driving the physical quantity sensor 1, a predetermined voltage is applied to the swing structure 3b, and a capacitance Ca is formed between the first fixed electrode 81b and the first mass portion 321b, and a capacitance Cb is formed between the second fixed electrode 82b and the base portion 325a of the second mass portion 325.

When acceleration Az is applied to the physical quantity sensor 1b, the movable body 32b swings around the rotation axis aY while torsionally deforming the support beam 33 due to the difference in rotational moment between the first mass portion 321b and the second mass portion 325. By such swinging of the movable body 32b, a gap between the first mass portion 321b and the first fixed electrode 81b and a gap between the base portion 325a of the second mass portion 325 and the second fixed electrode 82b change, respectively, and the capacitances Ca and Cb change accordingly. For that reason, the physical quantity sensor 1b can detect the acceleration Az based on the amount of change in the capacitances Ca and Cb.

The first mass portion 321b and the second mass portion 325 are respectively formed with a plurality of damping holes 30 penetrating the movable body 32b in the thickness direction along the Z-axis. The plurality of damping holes 30 are uniformly disposed over the entire region of the first mass portion 321b and the second mass portion 325, and in particular, are disposed in a matrix in the X-axis direction and the Y-axis direction in this embodiment. Each of the plurality of damping holes 30 has a square cross-sectional shape, and has the same shape and size. In the first mass portion 321b, the base portion 325a, and the torque generation portion 325b, occupancy rates of the plurality of damping holes 30 are equal. The terms "uniform", "square", and "equal in occupancy rate" here are the same as in the first embodiment.

In each of the first mass portion 321b and the second mass portion 325 constituting the movable body 32b, a first through-hole 35c and a second through-hole 35d are provided as a plurality of through-holes penetrating the movable body 32b in the thickness direction along the Z-axis are provided at positions where the first and second through-holes 35c and 35d overlap the plurality of protrusions 6c and 6d provided on the substrate 2 in plan view from the Z-axis direction.

In detail, in the first mass portion 321b as the first movable portion, the first through-hole 35c is provided at each end of the first mass portion 321b on the minus side in the X-axis direction and at each of both ends along the Y-axis direction. The first through-hole 35c is provided to oppose the protrusion 6c provided in the region of the second dummy electrode 84 which is disposed on the substrate 2 so as to oppose the first mass portion 321b. In the second mass portion 325 as the second movable portion, the second through-hole 35d is provided at an end portion on the minus side of the torque generation portion 325b of the second mass portion 325 in the X-axis direction and at each of both ends along the Y-axis direction. The second through-hole 35d is provided so as oppose the protrusion 6d provided in the region of the first dummy electrode 83b which is disposed on the substrate 2 so as to oppose the torque generation portion 325b of the second mass portion 325.

Similarly as in the first embodiment, the width dimension of the first through-hole 35c and the second through-hole 35d may be smaller than the width dimension of the protrusions 6c and 6d. As such, by making the width dimension of the first through-hole 35c and the second through-hole 35d as the through-hole smaller than the width dimensions of the protrusions 6c and 6d, toughness of the protrusions 6c and 6d can be enhanced while bringing the first mass portion 321b and the second mass portion 325, which constitute the movable body 32b, into contact with the protrusions 6c and 6d with a small area.

Protrusion

Here, the protrusions 6c and 6d are integrally formed with the substrate 2, and are provided at positions symmetrical and parallel to the rotation axis (swing central axis) aY in plan view. The protrusions 6c and 6d are disposed at positions overlapping the first through-hole 35c or the second through-hole 35d, and the movable body 32b (first mass portion 321b or second mass portion 325). The configuration of the protrusions 6c and 6d is the same as that of the protrusions 6a and 6b in the first embodiment described above, and thus detailed description thereof will be omitted.

Lid

The lid 5 has the recess 51 open to the lower surface side, similarly as in the first embodiment. The lid 5 is bonded to the upper surface of the substrate 2 so as to accommodate the swing structure 3b in the recess 51. The storage space S which accommodates the swing structure 3b is formed inside thereof by the lid 5 and the substrate 2. The configuration of the lid 5 according to the second embodiment is the same as that of the first embodiment and thus the detailed description is omitted. However, in the second embodiment, the substrate 2 and the lid 5 are bonded by using a glass frit 59 (low melting point glass).

According to the physical quantity sensor 1b according to the second embodiment described above, the plurality of protrusions 6c and 6d are disposed at positions overlapping the movable body 32b (first mass portion 321b and second mass portion 325) in plan view on the movable body 32b side of the substrate 2. Furthermore, since the first through-hole 35c and the second through-hole 35d are provided in the movable body 32b at the positions where the first and second through-holes 35c and 35d overlap the protrusions 6c and 6d in plan view, the contact area between the movable body 32b and the protrusions 6c and 6d due to excessive displacement of the movable body 32b can be reduced. With this configuration, sticking of the movable body 32b and the protrusions 6c and 6d can be prevented or reduced. In addition, according to the physical quantity sensor 1b according to the second embodiment, the same effect as the physical quantity sensor 1 of the first embodiment described above can be obtained.

Third Embodiment

Figure 8:
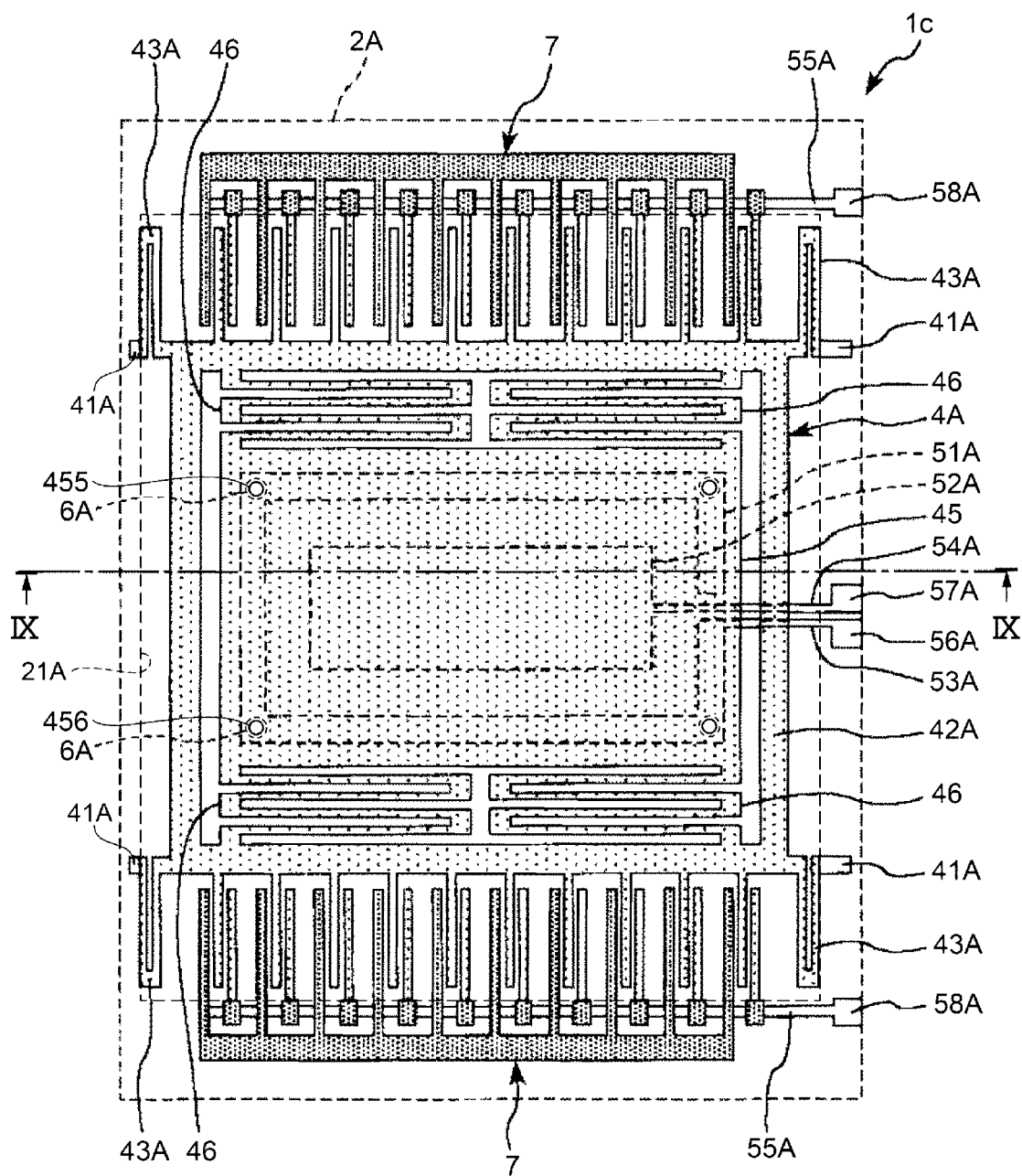
FIG. 8 is a plan view (top view) illustrating a physical quantity sensor according to a third embodiment.

Next, a third embodiment will be described with reference to FIGS. 8 and 9. FIG. 8 is a plan view (top view) illustrating a physical quantity sensor according to the third embodiment. FIG. 9 is a cross-sectional view taken along line IX-IX in FIG. 8. This embodiment is the same as the first embodiment described above except that the present disclosure is applied to a gyro sensor. In the following description, the third embodiment will be described focusing on differences from the embodiment described above, and the description of the same matters will be omitted.

A physical quantity sensor 1c illustrated in FIG. 8 is a gyro sensor that measures an angular velocity around the Y-axis. The physical quantity sensor 1c is, as illustrated in FIGS. 8 and 9, includes a base substrate 2A as a substrate, a lid 3A, a vibration structure 4A (movable electrode), a drive electrode 51A for driving and vibrating the vibration structure 4A, a pair of detection electrodes 7 for detecting a driving vibration of the vibration structure 4A, a monitor electrode 52A for detecting a driving state of the vibration structure 4A, and a plurality of protrusions 6A having a function of preventing or reducing sticking of the base substrate 2A and the vibration structure 4A.

The base substrate 2A as substrate and the lid 3A are bonded to each other, and a space is formed between the base substrate 2A and the lid 3A to accommodate the vibration structure 4A and the pair of detection electrodes 7.

The base substrate 2A and the lid 3A are each in a plate shape, and are disposed along an XY-plane (reference plane) which is a plane including the X-axis and the Y-axis. On the upper surface of the base substrate 2A, a recess 21A for allowing the movable portion of the vibration structure 4A to swing is provided. On the lower surface of the lid 3A, a recess 31A formed to cover the vibration structure 4A and the pair of detection electrodes 7 in a non-contact manner is provided.

The vibration structure 4A includes detection portions 42A (movable bodies), four anchor portions 41A fixed to the base substrate 2A, and four beam portions 43A coupling the detection portions 42A and the four anchor portions 41A (second beam portion), a drive portion 45 (movable body), and four beam portions 46 (first beam portions) coupling the detection portion 42A and the drive portion 45, and these portions are integrally formed.

The detection portion 42A includes a frame portion having a frame shape in plan view and a movable detection electrode portion configured by of a plurality of electrode fingers extending outward from the frame along the Y-axis direction.

The four anchor portions 41A are bonded and fixed to the upper surface of the base substrate 2A outside the recess 21A of the base substrate 2A described above. The four anchor portions 41A are disposed to be separated from each other on the outside of the detection portion 42A in plan view.

The four beam portions 43A are provided corresponding to the four anchor portions 41A, and respectively connect the corresponding anchor portions 41A and the detection portion 42A. Each beam portion 43A has a serpentine shape extending in the X-axis direction while reciprocating in the Y-axis direction in plan view. With this configuration, the length of each beam portion 43A can be increased while achieving miniaturization. Further, by lengthening the length of each beam portion 43A, it is possible to facilitate displacement of the detection portion 42A in the X-axis direction with bending deformation of each beam portion 43A. Each beam portion 43A may not have the serpentine shape as described above, and may have, for example, a shape extending in the Y-axis direction in plan view.

The drive portion 45 is disposed inside the detection portion 42A described above in plan view. With the upper surface of the base substrate 2A described above as a reference plane, the drive portion 45 has a plate shape along the reference plane.

The four beam portions 46 connect the detection portion 42A and the drive portion 45, respectively. Each beam portion 46 has a serpentine shape extending in the Y-axis direction while reciprocating in the X-axis direction. With this configuration, the length of each beam portion 46 can be increased while achieving miniaturization. By increasing the length of each beam portion 46, displacement of the drive portion 45 in the Z-axis direction with bending deformation of each beam portion 46 can be made easy.

The drive electrode 51A is fixed to the bottom surface of the recess 21A formed in the base substrate 2A described above. The drive electrode 51A is disposed to oppose the drive portion 45 with a gap. Here, the drive electrode 51A is disposed at a position where the drive electrode 51A overlaps the drive portion 45 in plan view. Such a drive electrode 51A is electrically coupled to a terminal 56A provided outside the recess 21A on the upper surface of the base substrate 2A through a wiring 53A.

The pair of detection electrodes 7 is respectively bonded and fixed to the upper surface of the base substrate 2A outside the recess 21A of the base substrate 2A described above. The pair of detection electrodes 7 is arranged side by side in the Y-axis direction so as to sandwich the vibration structure 4A. Such a pair of detection electrodes 7 is collectively formed together with the vibration structure 4A by processing (for example, etching) one substrate (for example, silicon substrate).

Each detection electrode 7 is configured by a plurality of electrode fingers alternately arranged side by side along the X-axis direction and a coupling portion which couples every other ones of the end portions on the opposite side to the vibration structure 4A of a plurality of electrode fingers. Each electrode finger extends along the Y-axis direction.

Each electrode finger coupled by the coupling portion is opposed to one side surface of the electrode finger of the detection portion 42A described above, while each electrode finger not coupled by the coupling portion is opposed to the other side surface of the electrode finger of the detection portion 42A.

Such a detection electrode 7 is electrically coupled to a terminal 58A provided outside the recess 21A on the upper surface of the base substrate 2A through a wiring 55A.

The monitor electrode 52A is bonded and fixed to the bottom surface of the recess 21A formed on the base substrate 2A described above. The monitor electrode 52A is disposed at a position where the monitor electrode 52A overlaps the drive portion 45 in plan view. Such a monitor electrode 52A is electrically coupled to a terminal 57A provided outside the recess 21A on the upper surface of the base substrate 2A through a wiring 54A.

The physical quantity sensor 1c configured as described above operates as follows.

A periodically changing voltage (for example, an alternating voltage) is applied as a drive voltage between the drive electrode 51A and the drive portion 45 which are opposed to each other. Then, the electrostatic attractive force whose intensity periodically changes is generated between the drive electrode 51A and the drive portion 45, which causes the drive portion 45 to vibrate in the Z-axis direction with elastic deformation of the beam portion 46. In this case, the electrostatic capacitance between the monitor electrode 52A and the drive portion 45 is detected, and the drive voltage is controlled as needed based on the detection result. With this configuration, vibration of the drive portion 45 can be controlled to be desired vibration.

Thus, when an angular velocity around the Y-axis is applied to the physical quantity sensor 1c in a state where the drive portion 45 is vibrated, Coriolis force in the X-axis direction is generated in the drive portion 45, and the detection portion 42A vibrates in the X-axis direction by action of Coriolis force. With this configuration, the capacitance between the detection electrode 7 and the detection portion 42A changes. Accordingly, the angular velocity applied to the physical quantity sensor 1c can be detected based on the capacitance.

As illustrated in FIG. 8, the plurality of (four in this embodiment) protrusions 6A are disposed at the side of the drive portion 45 of the base substrate 2A at a positions where the plurality of protrusions 6A overlap the outer periphery of the drive portion 45 (movable body) in plan view. Through-holes 455 and 456 penetrating the front and back of the drive portion 45 are provided at positions where the drive portion 45 (movable body) overlaps and is opposed to the plurality of protrusions 6A and the drive portion 45 (movable body).

With this configuration, since contact between the drive portion 45 and the base substrate 2A is due to the protrusion 6A of the portion overlapping the outer peripheral portions of the through-holes 455 and 456, the contact area can be reduced, and sticking of the drive portion 45 to the base substrate 2A can be prevented or reduced by the protrusion 6A. Here, since the protrusion 6A is provided at the side of the base substrate 2A, toughness of the protrusion 6A can be enhanced and damage to the protrusion 6A can be reduced. Excessive displacement of the drive portion 45 can be restricted by the protrusion 6A, and damage or the like of the vibration structure 4A which is a structure including the drive portion 45 can be prevented or reduced.

Fourth Embodiment

Next, a physical quantity sensor according to a fourth embodiment will be described with reference to FIG. 10.

Figure 10:
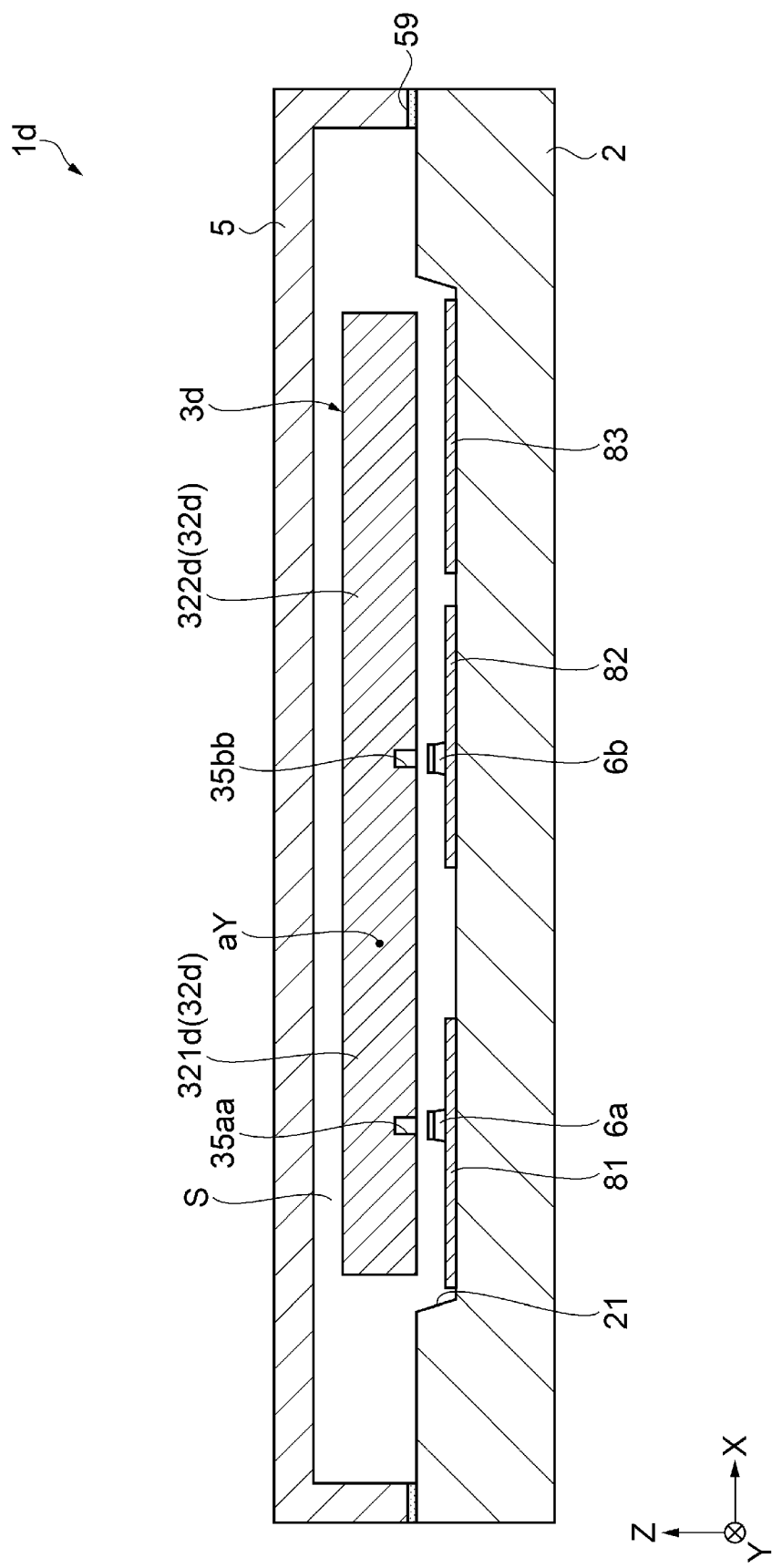
FIG. 10 is a cross-sectional view illustrating a physical quantity sensor according to a fourth embodiment.

FIG. 10 is a cross-sectional view illustrating the physical quantity sensor according to the fourth embodiment. A physical quantity sensor 1d according to the fourth embodiment is the same as the physical quantity sensor 1 according to the first embodiment except that the through-hole provided in the movable body is a recess having a bottom. In the following description, the fourth embodiment will be described focusing on the recess of the movable body which is a different configuration, the same reference numerals are attached to the same matters, and the description thereof will be omitted.

The physical quantity sensor 1d illustrated in FIG. 10 is used, for example, as an inertial sensor, and more specifically, as an acceleration sensor capable of measuring acceleration in the Z-axis direction. Such a physical quantity sensor 1d includes the substrate 2, a swing structure (element portion) 3d disposed on the substrate 2, and the lid 5 bonded to the substrate 2 so as to cover the swing structure 3d.

The substrate 2 includes the plurality of protrusions 6a and 6b that prevent or reduce sticking of the swing structure 3d (movable body 32d) to the substrate 2. The plurality of (four in this embodiment) protrusions 6a and 6b are disposed at the positions where the plurality of protrusions 6a and 6b overlap the swing structure 3d in plan view from the Z-axis direction, on the bottom surface of the recess 21 which is the swing structure 3d side of the substrate 2. The configuration of the protrusions 6a and 6b is the same as that of the first embodiment described above, and thus the detailed description will be omitted.

The swing structure 3d is provided above the substrate 2. The swing structure 3 includes the movable body 32d provided opposed to the substrate 2 and displaceable with respect to a anchor portion (not illustrated) bonded to a mount (not illustrated) provided on the substrate 2. The first recesses 35aa and 35bb which have a bottom and are at positions overlapping the plurality of protrusions 6a and 6b provided on the substrate 2 in plan view from the Z-axis direction and open to the surface opposed to the substrate 2 are provided in a first mass portion 321d and a second mass portion 322d constituting the movable body 32d, respectively.

The width dimension of the first recesses 35aa and 35bb may be smaller than the width dimension of the protrusions 6a and 6b. As such, by making the width dimension of the first recesses 35aa and 35bb smaller than the width dimension of the protrusions 6a and 6b, toughness of the protrusions 6a and 6b can be enhanced while bringing the first mass portion 321d and the second mass portion 322d, which constitute the movable body 32d, into contact with the protrusions 6a and 6b with a small area.

According to the physical quantity sensor 1d of the fourth embodiment, since the first recesses 35aa and 35bb which are at the positions where the first recesses 35aa and 35bb overlap the protrusions 6a and 6b provided on the movable body 32d side of the substrate 2 in plan view and open to the surface of the movable body 32d opposed to the substrate 2 opposed to the substrate 2 are provided, the contact area between the movable body 32d and the protrusions 6a and 6b due to excessive displacement of the movable body 32d can be reduced. With this configuration, it is possible to prevent or reduce sticking of the movable body 32d and the protrusions 6a and 6b without reducing toughness of the protrusions 6a and 6b.

Since the protrusions 6a and 6b are disposed at the side of the substrate 2 at positions overlapping, in plan view, the first recesses 35aa and 35bb which are open to the surface of the movable body 32d opposed to the substrate 2, toughness of the protrusions 6a and 6b can be enhanced to reduce damage to the protrusions 6a and 6b.

Modification Examples of Through-Hole (First Recess)

Figure 11:
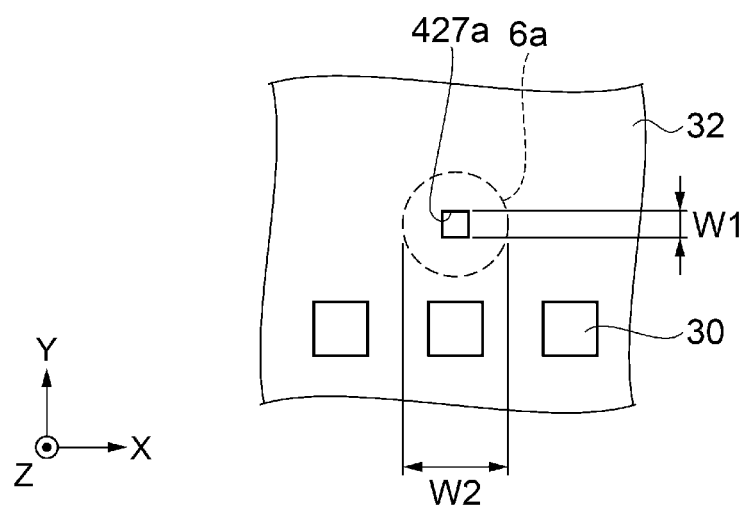
FIG. 11 is a plan view illustrating Modification Example 1 of a through-hole provided in a movable body.
Figure 12:
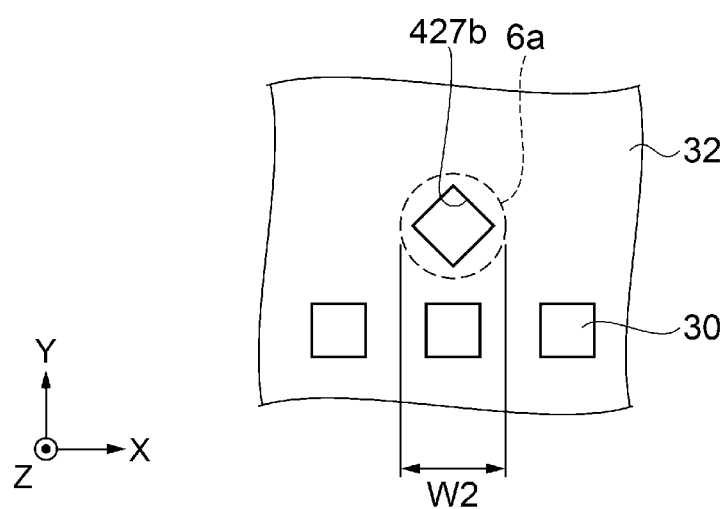
FIG. 12 is a plan view illustrating Modification Example 2 of the through-hole provided in the movable body.
Figure 13:
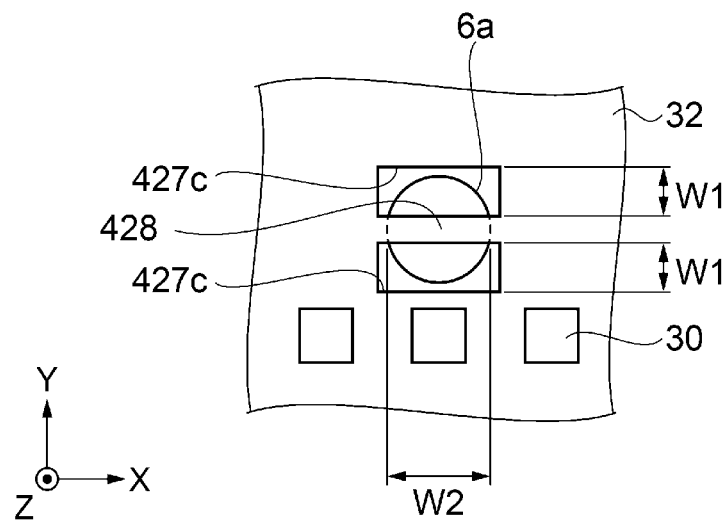
FIG. 13 is a plan view illustrating Modification Example 3 of the through-hole provided in the movable body.
Figure 14:
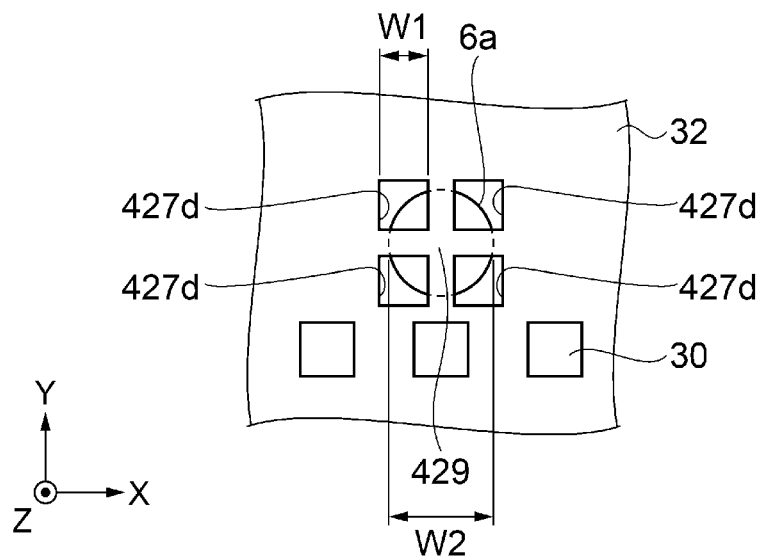
FIG. 14 is a plan view illustrating Modification Example 4 of the through-hole provided in the movable body.

Next, Modification Examples 1 to 4 of the through-hole (first recess) provided in the movable body will be described with reference to FIGS. 11 to 14. Here, FIG. 11 is a plan view which illustrates Modification Example 1 of the through-hole provided in the movable body. FIG. 12 is a plan view illustrating Modification Example 2 of the through-hole provided in the movable body. FIG. 13 is a plan view illustrating Modification Example 3 of the through-hole provided in the movable body. FIG. 14 is a plan view illustrating Modification Example 4 of the through-hole provided in the movable body. In the following description according to Modification Examples, the through-hole provided in the movable body is described as an example, but Modification Examples here can also be applied to the first recesses 35aa and 35bb provided in the movable body as illustrated in the fourth embodiment.

Modification Example 1 of Through-Hole

As illustrated in FIG. 11, a through-hole 427a according to Modification Example 1 is at a position opposed to the protrusion 6a provided on the substrate 2 (see FIG. 3), and penetrates the movable body 32. The through-hole 427a has a rectangular shape in plan view, and is configured as a square in this example. The through-hole 427a is provided such that the width dimension of the through-hole 427a is smaller than the width dimension of the protrusion 6a. That is, when a width which is a distance between two opposing sides of the through-hole 427a is W1 and a width (diameter) of the protrusion 6a is W2, the through-hole 427a is provided to satisfy W1<W2. In a positional relationship between the protrusion 6a and the through-hole 427a in plan view, the protrusion 6a is disposed at a position where the protrusion 6a overlaps the through-hole 427a and the movable body 32. In other words, the protrusion 6a may have a planar shape overlapping the through-hole 427a and the movable body 32. For example, all of the inside of the through-hole 427a may include the planar shape of the protrusion 6a and the remaining planar shape of the protrusion 6a may overlap the movable body 32 outside the through-hole 427a, or a part of the outer edge of the planar shape of the protrusion 6a may be in the through-hole 427a and the other portion of the outer edge may overlap the movable body 32.

Modification Example 2 of Through-Hole

As illustrated in FIG. 12, a through-hole 427b according to Modification Example 2 is at a position opposed to the protrusion 6a provided on the substrate 2 (see FIG. 3), and penetrates the movable body 32. The through-hole 427b has a quadrangular shape in plan view, and is configured as a rhombus shape in this example. The through-hole 427b is provided with the width dimension of the through-hole 427b smaller than the width dimension of the protrusion 6a. In a positional relationship between the protrusion 6a and the through-hole 427b in plan view, the protrusion 6a is disposed at a position where the protrusion 6a overlaps the through-hole 427b and the movable body 32, similarly as in Modification Example 1.

Modification Example 3 of Through-Hole

As illustrated in FIG. 13, a through-hole 427c according to Modification Example 3 is at a position opposed to the protrusion 6a provided on the substrate 2 (see FIG. 3), and penetrates the movable body 32. The through-holes 427c has a rectangular shape in plan view, and in this example, two through-holes 427c are provided on both sides of a beam 428 one by one. Each through-hole 427c is provided with its width dimension smaller than the width dimension of the protrusion 6a. That is, when a width which is a distance between two opposing sides of the through-hole 427c is W1 and a width (diameter) of the protrusion 6a is W2, the through-hole 427c is provided to satisfy W1<W2. In a positional relationship between the protrusion 6a and the two through-holes 427c in plan view, the protrusion 6a is disposed at a position where the protrusion 6a overlaps the two through-holes 427c and the movable body 32. In other words, the protrusion 6a may have a planar shape overlapping at least one of the two through-holes 427c and the movable body 32. For example, all of the insides of the two through-holes 427c may include the planar shape of the protrusion 6a and the remaining planar shape of the protrusion 6a may overlap the movable body 32 other than the two through-holes 427c, or a part of the outer edge of the planar shape of the protrusion 6a may be in any one of the through-holes 427c and the other portion of the outer edge may overlap the movable body 32.

Modification Example 4 of Through-Hole

As illustrated in FIG. 14, a through-hole 427d according to Modification Example 4 is at a position opposed to the protrusion 6a provided on the substrate 2 (see FIG. 3), and penetrates the movable body 32. The through-holes 427d has a substantially square shape in plan view, and in this example, four through-holes 427d are provided with a cross-shaped beam 429 therebetween. Each through-hole 427d is provided with its width dimension smaller than the width dimension of the protrusion 6a. That is, when a width which is a distance between two opposing sides of the through-hole 427d is W1 and a width (diameter) of the protrusion 6a is W2, the through-hole 427d is provided to satisfy W1<W2. In a positional relationship between the protrusion 6a and the four through-holes 427d in plan view, the protrusion 6a is disposed at a position where the protrusion 6a overlaps the four through-holes 427d and the movable body 32. In other words, the protrusion 6a may have a planar shape overlapping at least one of the four through-holes 427d and the movable body 32. For example, all of the insides of the four through-holes 427d may include the planar shape of the protrusion 6a and the remaining planar shape of the protrusion 6a may overlap the movable body 32 other than the four through-holes 427d, or a part of the outer edge of the planar shape of the protrusion 6a may be in any one of the through-holes 427d and the other portion of the outer edge may overlap the movable body 32.

According to Modification Examples 1 to 4 described above, by making the width W1 of the through-holes 427a, 427b, 427c, and 427d smaller than the width W2 of the protrusion 6a, similarly as in the embodiment described above, toughness of the protrusion 6a can be enhanced while bringing the protrusions 6a into contact with the movable body 32 with a small area.

In Modification Examples 1 to 4 described above, although the through-holes 427a, 427b, 427c, and 427d opposed to one protrusion 6a have been described as an example, the present disclosure can be applied to other plural protrusions and through-holes as well. Assuming that the width of the through-hole is W1 and the width (diameter) of the protrusion is W2, it suffices to satisfy W1<W2, and the planar shape of the through-hole does not matter.

The terms "square", "rhombus", and "rectangular shape" in Modification Examples 1 to 4 are meant to include a case where a shape is deviated from a square, a rhombus, and a rectangular shape, for example, the four corners do not form corners and chamfering and R roundness (rounding) are made thereto, at least one corner is deviated from 90 degrees, or a length of at least one side is different from the lengths of the other sides, for example, by taking into account an error that may occur in manufacturing or the like, in addition to a case where a shape agrees with a square, a rhombus, and a rectangular shape.

Modification Examples of Protrusion

Figure 15:
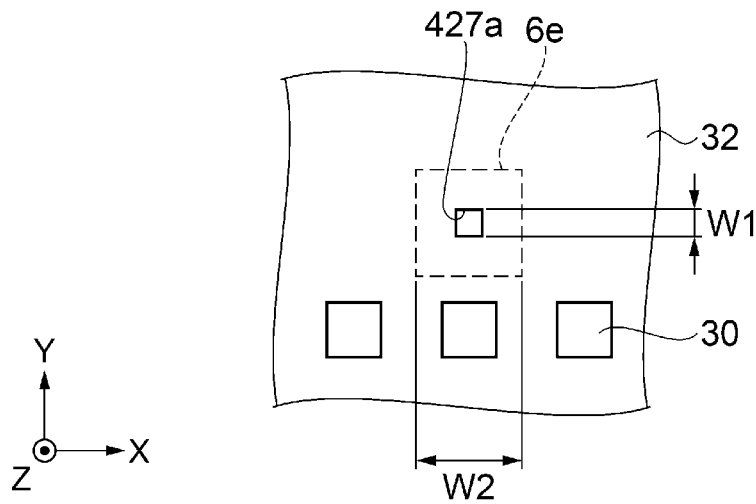
FIG. 15 is a plan view illustrating Modification Example 1 of a protrusion.
Figure 16:
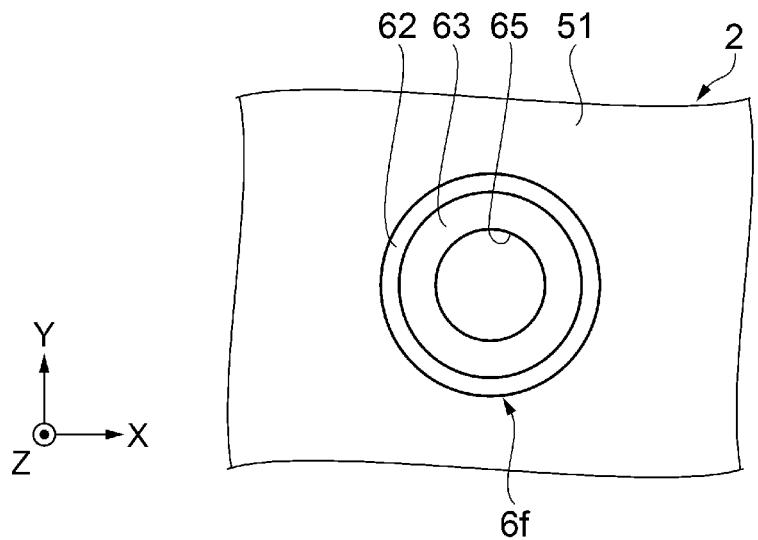
FIG. 16 is a plan view illustrating Modification Example 2 of the protrusion.

Next, Modification Example 1 and Modification Example 2 of the protrusion provided on the substrate will be described with reference to FIGS. 15, 16, and 17. Here, FIG. 15 is a plan view illustrating Modification Example 1 of the protrusion. FIG. 16 is a plan view illustrating Modification Example 2 of the protrusion. FIG. 17 is a cross-sectional view illustrating Modification Example 2 of the protrusion.

Modification Example 1 of Protrusion

As illustrated in FIG. 15, a protrusion 6e according to Modification Example 1 is provided in the substrate 2 (see FIG. 3). The protrusion 6e has a rectangular shape in plan view, and is configured as a square in this example. The protrusion 6e is provided at a position opposed to the through-hole 427a, which has a substantially square shape in plan view and is provided through the movable body 32. The through-hole 427a is provided such that the width dimension of the through-hole 427a is smaller than the width dimension of the protrusion 6e. That is, when a width which is a distance between two opposing sides of the through-hole 427a is W1 and a width (diameter) of the protrusion 6e is W2, the through-hole 427a is provided to satisfy W1<W2. In the positional relationship between the protrusion 6e and the through-hole 427a in plan view, the protrusion 6e is disposed at a position where the protrusion 6e overlaps the through-hole 427a and the movable body 32. In other words, the protrusion 6e may have a planar shape overlapping the through-hole 427a and the movable body 32. For example, all of the inside of the through-hole 427a may include the planar shape of the protrusion 6e and the remaining planar shape of the protrusion 6e may overlap the movable body 32 outside the through-hole 427a, or a part of the outer edge of the planar shape of the protrusion 6e may be in the through-hole 427a and the other portion of the outer edge may overlap the movable body 32.

The term "square" described above is meant to include a case where a shape is slightly deviated from the square, for example, the four corners do not form corners and chamfering and R roundness (rounding) are made thereto, at least one corner is deviated from 90 degrees, or a length of at least one side is different from the lengths of the other sides, for example, by taking into account an error that may occur in manufacturing or the like, in addition to a case where a shape agrees with a square.

According to the protrusion 6e according to Modification Example 1 described above, by making the width W1 of the through-holes 427a smaller than the width W2 of the substantially square protrusion 6e, similarly as in the embodiment described above, toughness of the protrusion 6e can be enhanced while bringing the protrusions 6e into contact with the movable body 32 with a small area.

Modification Example 2 of Projection

As illustrated in FIGS. 16 and 17, a protrusion 6f according to Modification Example 2 is provided on the surface of the substrate 2 opposed to the movable body 32. The protrusion 6f has a circular shape in plan view, and the protrusion 6f provided at a position opposed to the through-hole 35a provided through the movable body 32 includes the projection portion 61 integrally formed with the substrate 2, a conductor layer 62 covering the projection portion 61, the insulating layer 63 provided on the opposite side of the projection portion 61 of the conductor layer 62, and a recess 65 open to the movable body 32. Since the conductor layer 62 and the insulating layer 63 have the same configuration as that of the first embodiment described above, and thus the description thereof is omitted here.

The recess 65 is provided at the center of the protrusion 6f in plan view, and is open to the movable body 32. With this configuration, the top of the protrusion 6f is ring-shaped. Accordingly, the conductor layer 62 and the insulating layer 63 are provided to the top of the ring shape, and the opening by the recess 65 is not provided with the conductor layer 62 and the insulating layer 63.

According to Modification Example 2, the protrusion 6f is a ring-shaped top due to the recess 65 open to the movable body 32 side and thus, the contact area between the movable body 32 and the protrusion 6f can be further reduced. With this configuration, sticking of the movable body 32 and the protrusion 6f can be prevented or reduced.

Figure 18:
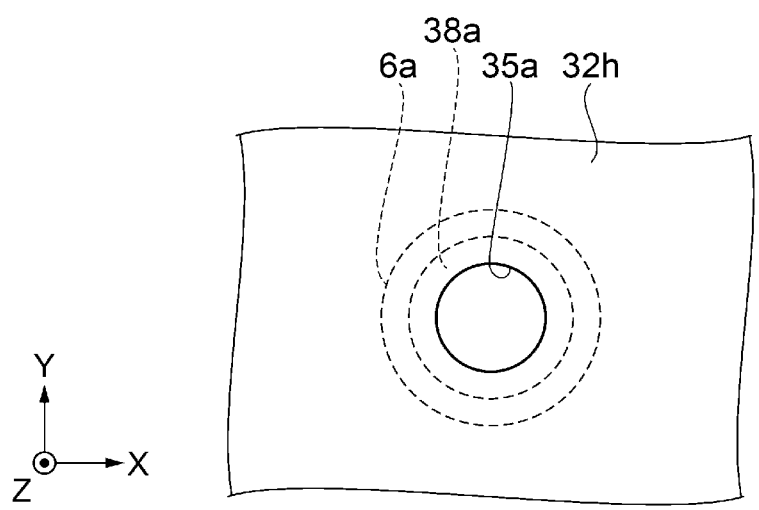
FIG. 18 is a plan view illustrating Application Example 1 according to a configuration of the movable body provided with the through-hole.
Figure 20:
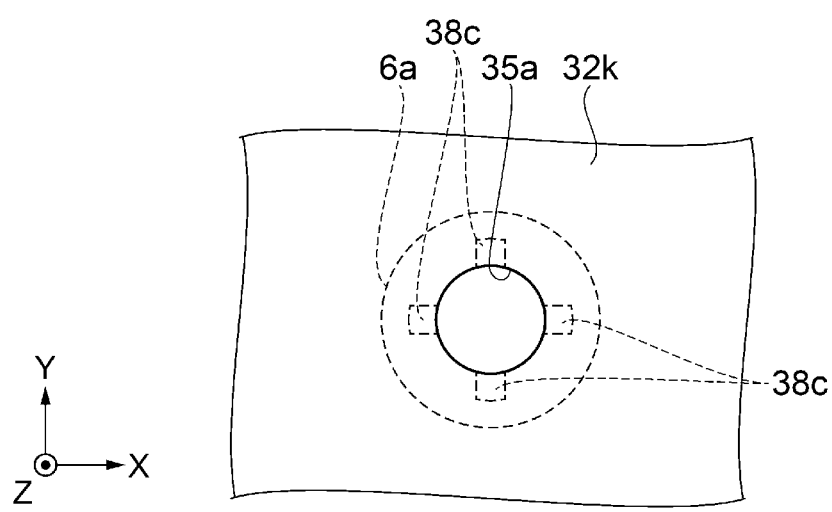
FIG. 20 is a plan view illustrating Application Example 2 according to the configuration of the movable body provided with the through-hole.

Application Examples According to Configuration of Movable Body Provided with Through-Hole Next, Application Example 1 and Application Example 2 according to the configuration of the movable body provided with the through-hole will be described with reference to FIGS. 18, 19, and 20. Here, FIG. 18 is a plan view which illustrates Application Example 1 relating to the configuration of the movable body provided with the through-hole. FIG. 19 is a cross-sectional view illustrating Application Example 1 relating to the configuration of the movable body provided with the through-hole. FIG. 20 is a plan view illustrating Application Example 2 relating to the configuration of the movable body provided with the through-hole. In the following description of Application Examples, the periphery of the through-hole 35a provided in a movable body 32h is described as an example, but Application Examples here can be applied also to the periphery of the first recesses 35aa and 35bb provided in the movable body 32d as illustrated in the fourth embodiment.

Application Example 1 of Through-Hole

As illustrated in FIGS. 18 and 19, a configuration of the movable body 32h according to Application Example 1 includes the through-hole 35a having a circular shape in plan view, which is positioned at a position opposed to the protrusion 6a provided on the substrate 2 and which penetrates the movable body 32h, and an outer peripheral protrusion 38a which is on the outer side from the outer edge of the through-hole 35a and protrudes toward the substrate 2 from a back surface 32r of the movable body 32h on the substrate 2 side. The outer peripheral protrusion 38a has a ring shape including an inner circumferential edge overlapping the outer edge of the through-hole 35a having a circular shape in plan view, and an outer circumferential edge concentric with the through-hole 35a.

In the positional relationship between the protrusion 6a and the through-hole 35a and the outer peripheral protrusion 38a in plan view, the protrusion 6a is disposed at a position where the protrusion 6a overlaps the through-hole 35a and the outer peripheral protrusion 38a. In other words, the protrusion 6a may have a planar shape overlapping the through-hole 35a and the outer peripheral protrusion 38a. For example, all of the inside of the through-hole 35a may include the planar shape of the protrusion 6a and the remaining planar shape of the protrusion 6a may overlap the outer peripheral protrusion 38a, or a part of the outer edge of the planar shape of the protrusion 6a may be in the through-hole 35a and the other portion of the outer edge may overlap the outer peripheral protrusion 38a. Similarly as in the first embodiment described above, the protrusion 6a includes the projection portion 61 integrally formed with the substrate 2, the conductor layer 62 covering the projection portion 61, and the insulating layer 63 provided at the side opposite to the projection portion 61 of the conductor layer 62.

Application Example 2 of Through-Hole

As illustrated in FIG. 20, a configuration of a movable body 32*k* according to Application Example 2, similarly as in Application Example 1, includes the through-hole 35*a* having a circular shape in plan view, which is positioned at a position opposed to the protrusion 6*a* provided on the substrate 2 and which penetrates the movable body 32*k*, and four outer circumferential protrusions 38*c* which is on the outer side from the outer edge of the through-hole 35*a* and protrudes toward the substrate 2 from the movable body 32*k*. The outer peripheral protrusions 38*c* are constituted by portions obtained by dividing the ring shape including the inner peripheral edge overlapping the outer edge of the through-hole 35*a* having a circular shape in plan view and the outer peripheral edge concentric with the through-hole 35*a* into four.

The outer peripheral protrusions 38*c* are not limited to the configuration of the portion obtained by dividing the ring shape into four, and may be protrusions provided along the outer edge of the through-hole 35*a*. For example, a plurality of the protrusions having a circular shape in plan view may be disposed along the outer edge of the through-hole 35*a*, or a plurality of the protrusions having a rectangular shape in plan view may be disposed along the outer edge of the through-hole 35*a*.

According to Application Example 1 and Application Example 2 described above, by providing the outer peripheral protrusion 38*c* on the outer periphery of the through-hole 35*a* of the movable bodies 32*h* and 32*k*, similarly as in the embodiment described above, toughness of the protrusions 6*a* can be enhanced while bringing the movable bodies 32*h* and 32*k* into contact with the protrusion 6*a* with a small area.

In the embodiments, Modification Examples, and Application Examples described above, the shape of the protrusions 6*a* (6*b*), 6*e*, and 6*f* in plan view has been described by exemplifying the case of a circular shape and a square shape, but is not limited thereto, and other shapes such as an elliptical shape, an oval shape, and a polygon may be used.

2. Sensor Device

Figure 21:
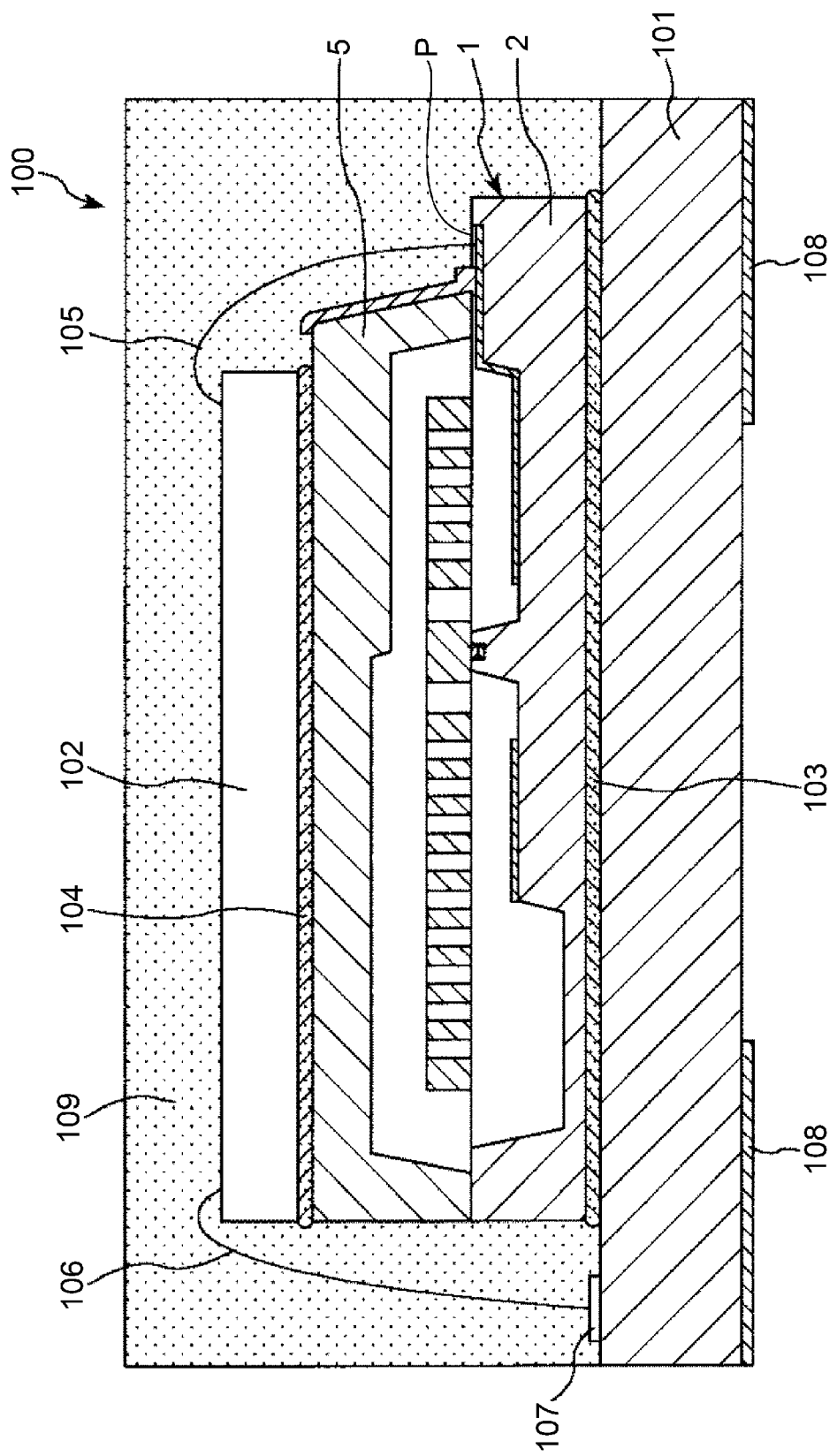
FIG. 21 is a cross-sectional view illustrating an example of a sensor device.

Next, a sensor device will be described with reference to FIG. 21. FIG. 21 is a cross-sectional view illustrating an example of the sensor device.

As illustrated in FIG. 21, a sensor device 100 includes a substrate 101, a physical quantity sensor 1 fixed to the upper surface of the substrate 101 through an adhesive layer 103, and an IC chip 102 as an electronic component fixed to the upper surface of physical quantity sensor 1 through adhesive layer 104. The physical quantity sensor 1 and the IC chip 102 are molded by a mold material 109 in a state where the lower surface of the substrate 101 is exposed. As the adhesive layers 103 and 104, for example, solder, silver paste, a resin adhesive (die attach agent) or the like can be used. For example, a thermosetting epoxy resin can be used as the mold material 109, and for example, the physical quantity sensor and the IC chip can be molded by a transfer molding method.

A plurality of terminals 107 are disposed on the upper surface of the substrate 101, and a plurality of mounting terminals 108 coupled to the terminals 107 through internal wiring and castellation (not illustrated) are disposed on the bottom surface thereof. The substrate 101 is not particularly limited, and for example, a silicon substrate, a ceramic substrate, a resin substrate, a glass substrate, a glass epoxy substrate, or the like can be used.

In the IC chip 102, for example, a drive circuit for driving the physical quantity sensor 1, a correction circuit for correcting differential signals of the electrostatic capacitances Ca and Cb, a detection circuit that measures acceleration from the differential signal of electrostatic capacitances Ca and Cb, an output circuit that converts a signal from the detection circuit into a predetermined signal and outputs the converted signal are included. Such an IC chip 102 is electrically coupled to the wirings 75, 76, and 77 (electrode pads P) of the physical quantity sensor 1 through a bonding wire 105, and is electrically coupled to the terminal 107 of the substrate 101 through a bonding wire 106.

Such a sensor device 100 includes the physical quantity sensor 1 and thus has excellent reliability.

3. Electronic Device

Figure 22:
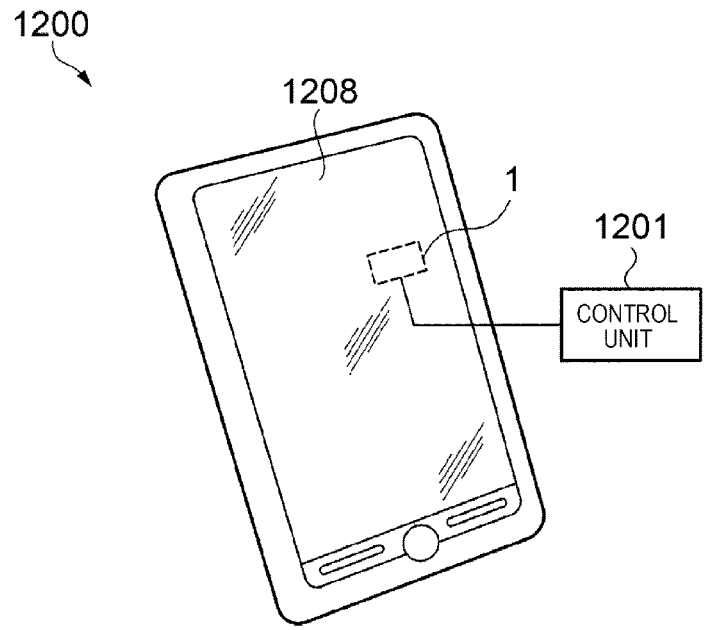
FIG. 22 is a perspective view schematically illustrating a configuration of a smartphone (mobile phone) as an example of an electronic device.

Next, a smartphone is illustrated as an electronic device using the physical quantity sensor 1 and will be described in detail with reference to FIG. 22. FIG. 22 is a perspective view schematically illustrating a configuration of the smartphone (mobile phone) which is an example of the electronic device.

In this figure, a smartphone 1200 incorporates the physical quantity sensor 1 described above. A detection signal (acceleration data) detected by the physical quantity sensor 1 is transmitted to a control unit 1201 of the smartphone 1200. The control unit 1201 is configured to include a central processing unit (CPU), and is able to perform control such as changing a display image displayed on a display unit 1208, sounding a warning sound or sound effect, or driving the vibration motor to vibrate the main body by recognizing the attitude and behavior of the smartphone 1200 based on the received detection signal. In other words, motion sensing of the smartphone 1200 can be performed, and display contents can be changed, sound, vibration, or the like can be generated from the measured attitude or behavior. In particular, when executing a game application, it is possible to experience a realistic feeling close to reality.

The smartphone 1200 as an example of such an electronic device includes the physical quantity sensor 1 described above and the control unit 1201, and thus has excellent reliability.

The electronic device provided with the physical quantity sensor 1 may be applied to, for example a personal computer, a tablet terminal, a digital still camera, a clock, an ink jet type discharging device (for example, an ink jet printer), a laptop personal computer, a TV, a video camera, a video tape recorder, a car navigation device, a pager, an electronic datebook (including a datebook with communication function), an electronic dictionary, a calculator, an electronic game machines, a word processor, a work station, a videophone, a security TV monitor, an electronic binoculars, a POS terminal, medical equipment (for example, electronic clinical thermometer, blood pressure monitor, blood glucose meter, electrocardiogram measurement device, ultrasonic diagnostic device, electronic endoscope), a fish finder, various measuring instruments, instruments (for example, instruments of vehicles, aircraft, and ships), a flight simulator, a seismometer, a pedometers, an inclinometers, a vibrometer that measures the vibrations of hard disks, an attitude control devices for a robot and flying objects such as drone, a control device used for inertial navigation for automatic driving of an automobile, or the like, in addition to the smartphone 1200 (mobile phone) described above.

4. Vehicle

Figure 23:
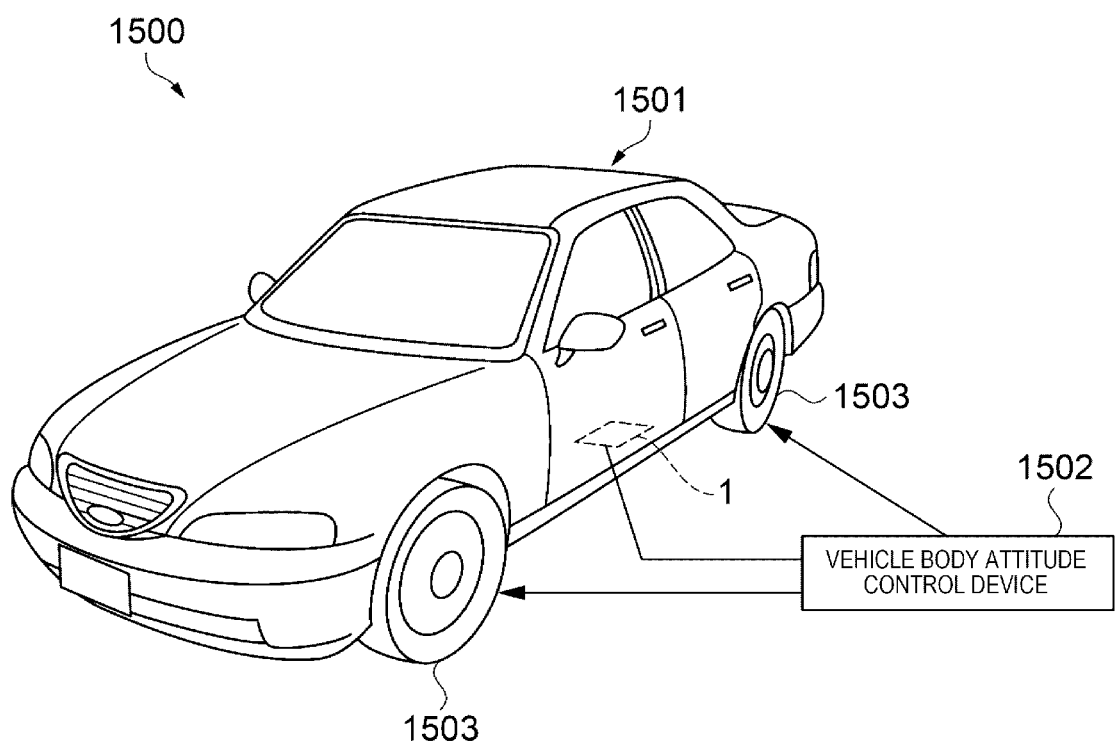
FIG. 23 is a perspective view illustrating a configuration of an automobile which is an example of a vehicle.

Next, a vehicle using the physical quantity sensor 1 is illustrated in FIG. 23 and will be described in detail. FIG. 23 is a perspective view illustrating a configuration of an automobile which is an example of the vehicle.

As illustrated in FIG. 23, the physical quantity sensor 1 is built in an automobile 1500. For example, the physical quantity sensor 1 can detect movement (position) and attitude of a vehicle body 1501. A detection signal of the physical quantity sensor 1 is supplied to a vehicle body attitude control device 1502 that controls movement and attitude of the vehicle body, and the vehicle body attitude control device 1502 can detect the attitude of the vehicle body 1501 based on the detection signal, and can control hardness of a suspension or control the brakes of the individual wheels 1503 according to the detection result.

In addition, the physical quantity sensor 1 can also be widely applied to a keyless entry system, an immobilizer, a car navigation system, a car air conditioner, an anti-lock braking system (ABS), an air bag, a tire pressure monitoring system (TPMS), an engine control system (engine system), an inertial navigation control device for automatic driving, and an electronic control unit (ECU) such as a battery monitor of a hybrid car or an electric automobile.

Further, in addition to the examples described above, the physical quantity sensor 1 applied to the vehicle may also be used for control, for example, movement and attitude control of a biped walking robot, a train, and the like, remote control of such as a radio control airplane, a radio control helicopter, a drone, and the like or movement and attitude control of autonomous aircraft, movement and attitude control of an agricultural machine and a construction machine, control of a rocket, an artificial satellite, a ship, an automatic guided vehicle (AGV), and the like. As described above, the physical quantity sensor 1, respective controllers (not illustrated), and attitude controllers are incorporated in realizing movement (position) and attitude control of various vehicles.

Such a vehicle is provided with the physical quantity sensor 1 and the control unit (for example, the vehicle body attitude control device 1502 as the attitude control unit), and thus has excellent reliability.

5. Traveling Support System

Figure 24:
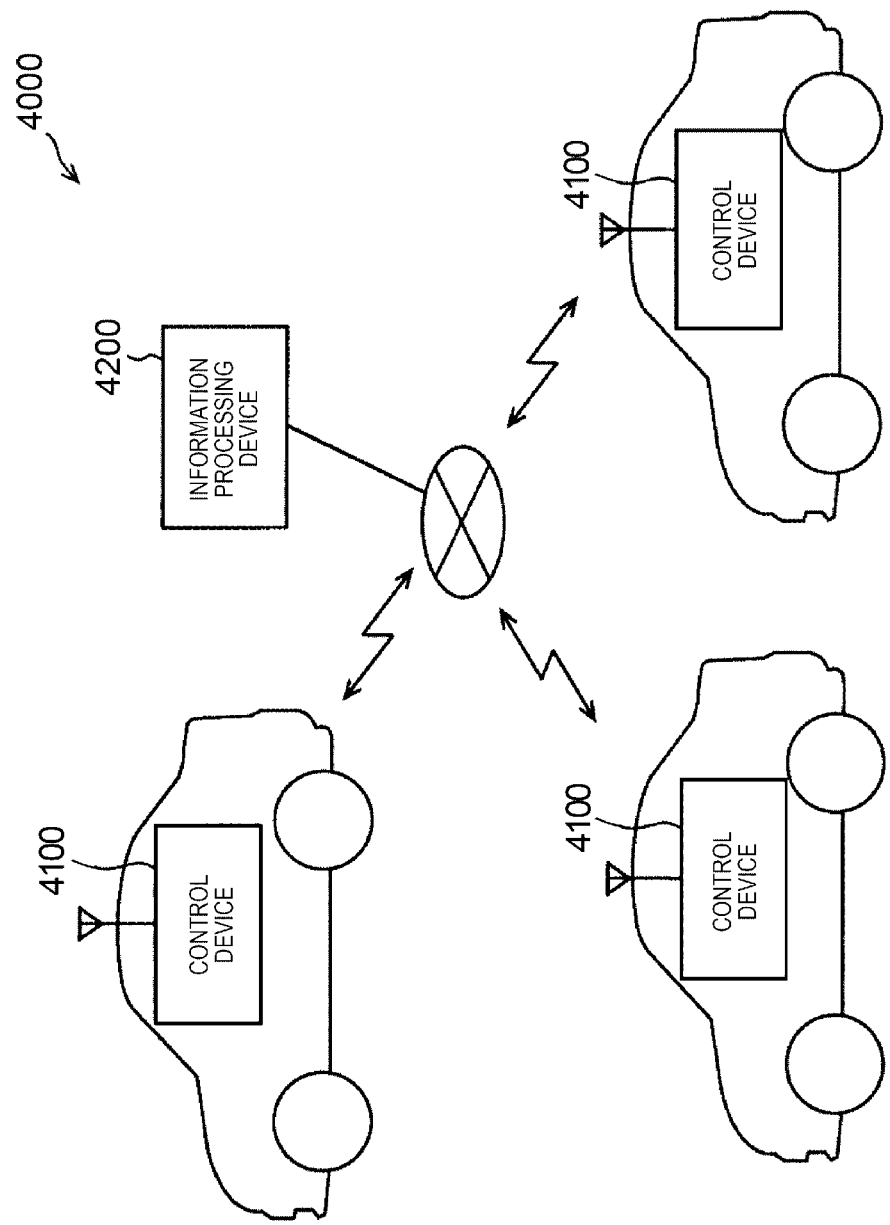
FIG. 24 is a diagram illustrating a schematic configuration of a traveling support system.
Figure 25:
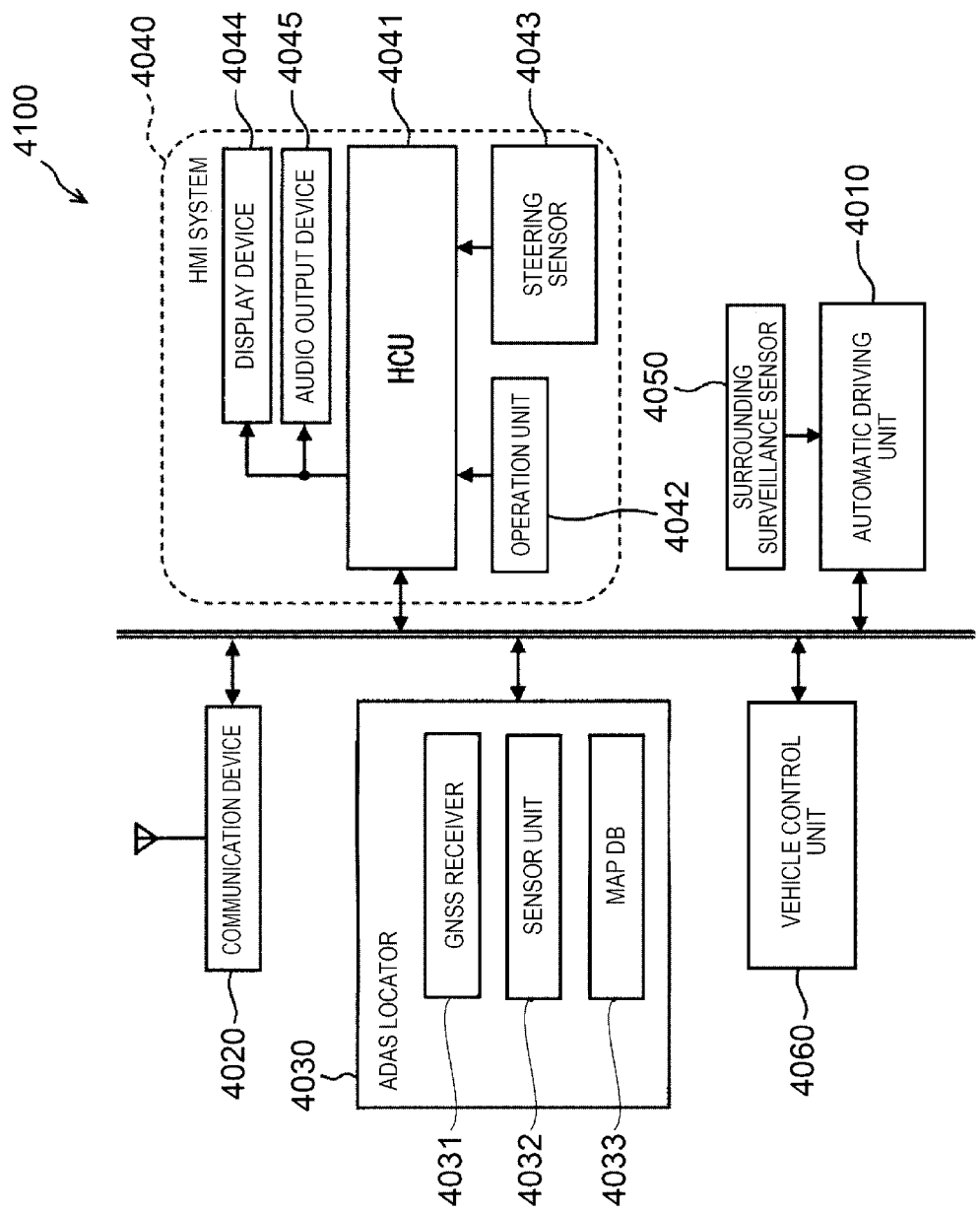
FIG. 25 is a functional block diagram illustrating the schematic configuration of the traveling support system.

Hereinafter, a traveling support system using the physical quantity sensor 1 will be described with reference to FIGS. 24 and 25. FIG. 24 is a diagram illustrating a schematic configuration of a traveling support system. FIG. 25 is a functional block diagram illustrating a schematic configuration of the traveling support system.

Schematic Configuration of Travelling Support System

As illustrated in FIG. 24, a traveling support system 4000 includes a control device 4100 and an information processing device 4200 mounted on each of a plurality of vehicles (vehicles).

The control device 4100 is mounted on a vehicle (hereinafter, automatically driven vehicle) that performs automatic driving that automatically controls at least one of acceleration, braking, and steering, and communicates with the information processing device 4200. The information processing device 4200 is, for example, a server device, collects vehicle information transmitted from each control device 4100 mounted on a plurality of automatic driving vehicles, transmits information obtained based on the collected vehicle information to each control device 4100. The information processing device 4200 may be formed of one server device or may be formed of a plurality of server devices.

Schematic Configuration of Control Device

Subsequently, a schematic configuration of a control device 4100 will be described with reference to FIG. 25. The control device 4100 is mounted on an automatic driving vehicle, and as illustrated in FIG. 25, includes an automatic driving unit 4010, a communication device 4020, an advanced driver assistance systems (ADAS) locator 4030, a human machine interface (HMI) system 4040, a surrounding surveillance sensor 4050, and a vehicle control unit 4060. The automatic driving unit 4010 as a control unit, the communication device 4020, the ADAS locator 4030, the HMI system 4040, and a vehicle control unit 4060 are coupled to, for example, an in-vehicle LAN, and can exchange information with each other through communication.

The communication device 4020 communicates with the outside of the vehicle. The communication device 4020 can perform wireless communication with, for example, at least one of an on-vehicle communication device mounted on a vehicle around the vehicle and a roadside device installed on a roadside. For example, the communication device 4020 can acquire position information, traveling speed information, and the like of vehicles around own vehicle by performing inter-vehicle communication with the on-vehicle communication device and road-to-vehicle communication with the roadside device.

The communication device 4020 performs communication with the information processing device 4200. When communication is performed with the information processing device 4200, for example, a configuration in which communication with the information processing device 4200 is performed through a communication network used for telematics communication by an on-vehicle communication module used for telematics communication such as the data communication module (DCM) may be adopted. A configuration in which the communication device performs communication with a roadside device and the information processing device 4200 through a communication network between the information processing device 4200 and the roadside device, may be adopted. The communication device 4020 outputs information acquired from the information processing device 4200 to the in-vehicle LAN or transmits vehicle information transmitted from the automatic driving unit 4010 through the in-vehicle LAN.

In addition, a configuration in which an in-vehicle communication module that performs wireless communication with at least one of the in-vehicle communication device mounted on a surrounding vehicle and the roadside device installed on the roadside and an in-vehicle communication module used for telematics communication are separately provided may be adopted, or a configuration in which the in-vehicle communication modules are integrally provided may be adopted.

The ADAS locator 4030 includes a global navigation satellite system (GNSS) receiver 4031, a sensor unit 4032 including the physical quantity sensor 1 described above, and a map database (hereinafter, DB) 4033 storing map data. The GNSS receiver 4031 receives positioning signals from a plurality of artificial satellites. The sensor unit 4032 including the physical quantity sensor 1 includes, for example, a three-axis gyro sensor and a three-axis acceleration sensor as other sensors. The map DB 4033 is a non-volatile memory, and stores map data such as link data, node data, a road shape, and a structure.

The ADAS locator 4030 sequentially measures a vehicle position of the vehicle mounted with the ADAS locator 4030 by combining a positioning signal received by the GNSS receiver 4031 and the measurement result of the sensor unit 4032 including the physical quantity sensor 1. For measurement of the vehicle position, a configuration in which a travel distance obtained from pulse signals sequentially output from a wheel speed sensor (not illustrated) mounted on the own vehicle is also used may be adopted. Then, the measured vehicle position is output to the in-vehicle LAN. The ADAS locator 4030 also reads map data from the map DB 4033 and outputs map data to the in-vehicle LAN. A configuration in which the map data is acquired from the outside of the own vehicle by using the on-vehicle communication module (not illustrated) such as DCM mounted on the own vehicle, for example, may be adopted.

As illustrated in FIG. 25, the HMI system 4040 includes a human machine interface control unit (HCU) 4041, an operation unit 4042, a steering sensor 4043, a display device 4044, and an audio output device 4045, and receives an input operation from the driver of the vehicle, presents information to the driver of the vehicle, and detects the state of the driver of the vehicle.

The operation unit 4042 is a group of switches operated by the driver of the own vehicle. The operation unit 4042 is used to perform various settings. For example, as the operation unit 4042, there are a steering switch provided in a spoke portion of steering of the own vehicle, a touch switch integrated with the display device 4044, and the like.

The steering sensor 4043 is a sensor for detecting that an occupant is touching the steering wheel of the own vehicle. Examples of the steering sensor 4043 include a touch sensor provided on the steering wheel, and a steering torque sensor that detects steering torque of the steering of the own vehicle. The detection result of the steering sensor 4043 is output to the HCU 4041.

The display device 4044 is, for example, a combination meter, a center information display (CID), a head-up display (HUD) or the like. The combination meter is disposed in front of the driver's seat of the vehicle. The CID is disposed above the center cluster in the own vehicle room. The combination meter and the CID display various images for information presentation on a display screen of a display based on image data acquired from the HCU 4041. The HUD projects light of the image based on the image data acquired from the HCU 4041 onto a projection area defined on a windshield of the vehicle. Light of the image reflected to the inside of the vehicle by the windshield is perceived by the driver sitting on the driver's seat. The driver can visually recognize a virtual image of the image projected by the HUD superimposed on the external scenery in front of the vehicle.

The audio output device 4045 is, for example, an audio speaker. The audio speaker is disposed, for example, in the lining of the door of the vehicle. The audio speaker presents information to an occupant such as a driver by means of sound to be reproduced.

The HCU 4041 includes a CPU, a memory such as a ROM and a RAM, an I/O, and a bus connecting these, and executes various processes by executing a control program stored in the memory. For example, the HCU 4041 causes at least one of the display device 4044 and the audio output device 4045 to present information according to an instruction from the automatic driving unit 4010. A part or all of the functions executed by the HCU 4041 may be configured as hardware by one or more ICs or the like.

The surrounding surveillance sensor 4050 detects vehicles such as pedestrians, non-human animals, bicycles, motorcycles, and other vehicles and obstacles such as falling objects as on the road, and stationary objects such as guardrails, curbs, and trees. In addition to the vehicles and the obstacles, the surrounding surveillance sensor also detects road markings such as a travel division line and a stop line. The surrounding surveillance sensor 4050 is, for example, a surrounding surveillance camera that captures an image of a predetermined range around the own vehicle and sensors such as a millimeter wave radar that transmits a survey wave to the predetermined range around the vehicle, a sonar, and a light detection and ranging/laser imaging detection and ranging (LIDAR).

The surrounding surveillance camera may be configured to use a stereo camera or may be configured to use a monocular camera. The surrounding surveillance camera sequentially outputs the captured image to be sequentially captured to the automatic driving unit 4010 as sensing information. A sensor that transmits a search wave such as the sonar, the millimeter wave radar, the LIDAR or the like sequentially outputs a scan result based on a reception signal obtained when a reflection wave reflected by an obstacle is received to the automatic driving unit 4010 as sensing information. A configuration in which two or more types of surrounding surveillance sensors 4050 have overlapping sensing ranges, such as performing sensing in front of the own vehicle using the surrounding surveillance camera and the millimeter wave radar together, may be adopted.

The vehicle control unit 4060 is an electronic control device that performs at least one of acceleration and deceleration control and steering control of the own vehicle. The vehicle control unit 4060 includes a steering ECU that performs steering control, a power unit control ECU that performs acceleration and deceleration control, and a brake ECU. The vehicle control unit 4060 acquires detection signals output from sensors such as an accelerator position sensor, a brake pedal operating force sensor, a steering angle sensor, a wheel speed sensor, and the like mounted on the own vehicle, and outputs a control signal to each traveling control device such as an electronically controlled throttle, a brake actuator, and an electric power steering (EPS) motor. The vehicle control unit 4060 can output the detection signals of the sensors described above to the in-vehicle LAN.

The automatic driving unit 4010 as a control unit includes a CPU, volatile memory, nonvolatile memory, I/O, and a bus connecting these, and executes various processes by executing a control program stored in the nonvolatile memory. For example, the automatic driving unit 4010 recognizes traveling environment of the own vehicle from the sensing result by the surrounding surveillance sensors 4050. Besides, the automatic driving unit 4010 performs an operation which substitutes for the driving operation by the driver by controlling the vehicle control unit 4060. The automatic driving unit 4010 corresponds to a traveling support device. A part or all of the functions executed by the automatic driving unit 4010 may be configured as hardware by one or a plurality of ICs or the like.

The automatic driving unit 4010 as a control unit can instruct the vehicle control unit 4060 based on the detection signal detected by the sensor unit 4032 to control at least one of acceleration, braking, and steering. The automatic driving unit 4010 can switch between execution and non-execution of the automatic driving according to change in the detection signal detected by the sensor unit 4032. In this manner, the automatic driving unit 4010 as a control unit that controls at least one of acceleration, braking, and steering may accurately switch the execution or non-execution of automatic driving according to the change in the detection signal detected by the sensor unit.

Such a traveling support system 4000 for a vehicle (vehicle) includes the sensor unit 4032 including the physical quantity sensor 1 described above and the automatic driving unit 4010 as a driving support device including the sensor unit 4032 and thus has excellent reliability.

Although the physical quantity sensor, the sensor device, the electronic device, the vehicle, and the traveling support system according to the present disclosure have been described based on the illustrated embodiments, the present disclosure is not limited thereto, and the configuration of each portion can be replaced with any configuration having a similar function. In addition, any other constitutional element may be added to the present disclosure.

In the embodiments described above, although a case where the present disclosure is applied to a seesaw type physical quantity sensor (acceleration sensor) and a parallel plate type gyro sensor is described as an example, the physical quantity sensor according to the present disclosure may be any sensor in which the movable body is displaceable relative to the substrate. Accordingly, the physical quantity sensor according to the present disclosure is not limited to the structure of the embodiment described above, and is also applicable to, for example, a flap-type physical quantity sensor.

In the following, contents derived from the embodiments described above will be described as each aspect.

[Aspect 1] A physical quantity sensor according to this aspect includes a substrate, a movable body that is provided displaceably in a state of being opposed to the substrate and is provided with a through-hole, and a protrusion configured integrally with the substrate at a side of the movable body of the substrate, in which the protrusion is provided at a position where the protrusion overlaps the through-hole and the movable body in plan view.

According to this aspect, since the protrusion is provided on the side of the movable body of the substrate, the through-hole is provided in the movable body disposed at a position where the through-hole overlaps the protrusion in plan view, and the protrusion and the through-hole are provided at the overlapping position in plan view, the contact area between the movable body and the projection due to excessive displacement of the movable body can be reduced. With this configuration, sticking of the movable body and the protrusion can be prevented or reduced.

Since the protrusion is disposed on the substrate side at a position where the protrusion overlaps the through-hole provided in the movable body in plan view, the area in contact with the movable body can be kept small even if the protrusions are enlarged, and toughness of the protrusion can be enhanced to reduce damage to the protrusion.

[Aspect 2] In the physical quantity sensor described in the aspect, $W1<W2$ may be satisfied, where $W1$ is a width of the through-hole and $W2$ is a width of the protrusion.

According to this aspect, by making the width of the through-hole smaller than the width of the protrusion, it is possible to increase toughness of the protrusion while making the movable body and the protrusion contact in a small area.

[Aspect 3] The physical quantity sensor described in the aspect may further include an electrode that is opposed to the movable body and is provided on the substrate, in which the protrusion may include a conductor layer having the same potential as the electrode.

According to this aspect, since the conductor layer of the protrusion is at the same potential as the electrode, at the time of manufacturing the physical quantity sensor, for example, when the substrate and another substrate are subjected to anodic bonding, sticking of the movable body and the substrate can be prevented or reduced by electrically coupling the movable body and the electrode.

[Aspect 4] In the physical quantity sensor described in the aspect, the conductor layer may be configured integrally with the electrode.

According to this aspect, the conductor layer of the protrusion and the electrode can be collectively formed. For that reason, complication of a manufacturing process of the physical quantity sensor accompanying formation of the protrusion can be reduced.

[Aspect 5] In the physical quantity sensor described in the aspect, the protrusion may have an insulating layer provided at a side opposite to the substrate with respect to the conductor layer.

According to this aspect, since the insulating layer of the protrusion is provided on the tip side of the protrusion with respect to the conductor layer, even if the movable body contacts the protrusion, a short circuit between the movable body and the electrode can be suppressed.

[Aspect 6] In the physical quantity sensor described in the aspect, the insulating layer may be a silicon oxide film.

According to this aspect, since the insulating layer is a silicon oxide film, the insulating layer having an excellent insulating property can be easily and accurately formed by a film forming method.

[Aspect 7] In the physical quantity sensor described in the aspect, the movable body may be provided swingably around a swing central axis, and may be divided into a first movable portion and a second movable portion with the swing central axis as a boundary in plan view, and the electrode may include a first electrode that is opposed to the first movable portion and is disposed on the substrate and a second electrode that is opposed to the second movable portion and is disposed on the substrate.

According to this aspect, it is possible to realize a so-called seesaw-type electrostatic capacitance type acceleration sensor.

[Aspect 8] In the physical quantity sensor described in the aspect, an area of the second movable portion may be larger than an area of the first movable portion in plan view.

According to this aspect, it is possible to easily make moments about the swing central axes of the first movable portion and the second movable portion different. In the movable body having such a first movable portion and second movable portion, the second movable portion easily contacts the substrate. For that reason, by applying the present disclosure in such a case, the effect becomes remarkable.

[Aspect 9] In the physical quantity sensor described in the aspect, the protrusion may be provided with a recess open to the side of the movable body.

According to this aspect, the contact area between the movable body and the protrusion can be further reduced by the recess open to the movable body side.

[Aspect 10] In the physical quantity sensor described in the aspect, a plurality of the protrusions may be provided at positions parallel to a swing central axis.

According to this aspect, it is possible to improve a position balance when the movable body contacts the protrusion, and to reduce breakage of the movable body.

[Aspect 11] A physical quantity sensor according to this aspect includes a substrate, a movable body that is provided displaceably in a state of being opposed to the substrate and is provided with a first recess open to a surface opposed to the substrate, and a protrusion configured integrally with the substrate at a side of the movable body of the substrate, in which the protrusion is provided at a position where the protrusion overlaps the first recess and the movable body in plan view.

According to this aspect, since the first recess is provided at a position where the first recess overlaps the protrusion provided on the movable body side of the substrate in plan view and is open to the surface of the movable body opposed to the substrate, the contact area between the movable body and the protrusion due to excessive displacement of the movable body can be reduced. With this configuration, sticking of the movable body and the protrusion can be prevented or reduced.

Since the protrusion is disposed on the substrate side at a position where the protrusion overlaps the first recess open to the surface of the movable body opposed to the substrate in plan view, damage to the protrusion can be reduced without reducing toughness of the protrusion.

[Aspect 12] A sensor device according to this aspect includes any one of the physical quantity sensors described above, and an electronic component electrically coupled to the physical quantity sensor.

According to this aspect, since the physical quantity sensor capable of preventing or reducing sticking of the movable body and the substrate is provided, reliability of the sensor device can be enhanced.

[Aspect 13] An electronic device according to this aspect includes any one of the physical quantity sensors described above, and a control unit that performs control based on a detection signal output from the physical quantity sensor.

According to this aspect, since the physical quantity sensor capable of preventing or reducing sticking of the movable body and the substrate is provided, reliability of the electronic device can be enhanced.

[Aspect 14] A vehicle according to this aspect includes any one of the physical quantity sensors described above, and a control unit that performs control based on a detection signal output from the physical quantity sensor.

According to this aspect, since the physical quantity sensor capable of preventing or reducing sticking of the movable body and the substrate is provided, reliability of the vehicle can be enhanced.

What is claimed is:

1. A physical quantity sensor comprising:
   a substrate;
   a movable body that is provided displaceably in a state of being opposed to the substrate and is provided with a plurality of damping holes and a through-hole, wherein the plurality of damping holes are disposed uniformly over the movable body, the through-hole is disposed at a side of the movable body, wherein each of the plurality of damping holes has a same size or shape, and the through-hole has a different shape from that of the damping holes; and
   a protrusion configured to be integrated with the substrate, wherein;
   a tip portion of the protrusion has a first width,
   a base portion of the protrusion has a second width that is greater than the first width,
   the tip portion is a portion that protrudes further out of the substrate than the base portion,
   the protrusion is provided at a position corresponding to the through-hole of the movable body in plan view, such that a center of the protrusion overlaps the through-hole, but does not overlap the damping holes,
   a width of the through-hole is W1,
   a width of the tip portion of the protrusion is W2, and
   W1<W2, such that any portion of the protrusion is prevented from entering into the through-hole.

2. The physical quantity sensor according to claim 1, further comprising:
   an electrode that is opposed to the movable body and is provided on the substrate, wherein
   the protrusion is covered with a conductor layer having the same potential as the electrode.

3. The physical quantity sensor according to claim 2, wherein
   the conductor layer is configured integrally with the electrode.

4. The physical quantity sensor according to claim 2, wherein
   the conductor layer is covered with an insulating layer.

5. The physical quantity sensor according to claim 4, wherein
   the insulating layer is a silicon oxide film.

6. The physical quantity sensor according to claim 2, wherein
   the movable body is provided swingably around a swing central axis and is divided into a first movable portion and a second movable portion with the swing central axis as a boundary in plan view, and
   the electrode includes a first electrode that is opposed to the first movable portion and is disposed on the substrate and a second electrode that is opposed to the second movable portion and is disposed on the substrate.

7. The physical quantity sensor according to claim 6, wherein
   an area of the second movable portion is larger than an area of the first movable portion in plan view.

8. The physical quantity sensor according to claim 1, wherein
   the protrusion is provided with a recess open to the side of the movable body.

9. The physical quantity sensor according to claim 1, wherein
   a plurality of protrusions is provided at positions parallel to a swing central axis.

10. A physical quantity sensor comprising:
    a substrate;
    a movable body that is provided displaceably in a state of being opposed to the substrate and is provided with a plurality of damping holes and a first recess at a side of the movable body, wherein the plurality of damping holes are disposed uniformly over the movable body, the first recess is disposed at a side of the movable body, wherein each of the plurality of damping holes has a same size or shape, and the first recess has a different shape from that of the damping holes; and
    a protrusion configured to be integrated with the substrate at a side of the protrusion that corresponds to the side of the movable body, such that when the movable body swings, the first recess of the movable body and the protrusion of the substrate oppose against each other, wherein:
    a tip portion of the protrusion has a first width,
    a base portion of the protrusion has a second width that is greater than the first width,
    the tip portion is a portion that protrudes further out of the substrate than the base portion,
    the protrusion is provided at a position corresponding to the first recess, such that a center of the protrusion overlaps the first recess of the movable body in plan view, a width of the first recess is W1, a width of the tip portion of the protrusion is W2, and W1<W2, such that any portion of the protrusion is prevented from entering into the first recess.

11. An electronic device comprising:

the physical quantity sensor according to claim 1; and a control unit that performs control based on a detection signal output from the physical quantity sensor.

12. An electronic device comprising:

the physical quantity sensor according to claim 10; and a control unit that performs control based on a detection signal output from the physical quantity sensor.

13. A vehicle comprising:

the physical quantity sensor according to claim 1; and a control unit that performs control based on a detection signal output from the physical quantity sensor.

14. A vehicle comprising:

the physical quantity sensor according to claim 10; and a control unit that performs control based on a detection signal output from the physical quantity sensor.

\* \* \* \* \*